(12) United States Patent
Yokoyama et al.

(10) Patent No.: US 8,547,368 B2
(45) Date of Patent: Oct. 1, 2013

(54) DISPLAY DRIVING CIRCUIT HAVING A MEMORY CIRCUIT, DISPLAY DEVICE, AND DISPLAY DRIVING METHOD

(75) Inventors: Makoto Yokoyama, Osaka (JP); Yasushi Sasaki, Osaka (JP); Yuhichiroh Murakami, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 659 days.

(21) Appl. No.: 12/734,363

(22) PCT Filed: Sep. 2, 2008

(86) PCT No.: PCT/JP2008/065765
§ 371 (c)(1),
(2), (4) Date: Apr. 27, 2010

(87) PCT Pub. No.: WO2009/084280
PCT Pub. Date: Jul. 9, 2009

(65) Prior Publication Data
US 2010/0245305 A1  Sep. 30, 2010

(30) Foreign Application Priority Data

Dec. 28, 2007  (JP) .................................. 2007-339353

(51) Int. Cl.
*G06F 3/038* (2013.01)
*G09G 5/00* (2006.01)
*G09G 3/30* (2006.01)
*G09G 3/36* (2006.01)

(52) U.S. Cl.
USPC ............... 345/205; 345/76; 345/90; 345/98; 345/204; 345/211

(58) Field of Classification Search
USPC ................................................ 345/87–99
See application file for complete search history.

(56) References Cited

U.S. PATENT DOCUMENTS 3,675,043 A   7/1972  Bell
4,716,303 A  12/1987  Mimoto
(Continued)

FOREIGN PATENT DOCUMENTS

CN   1782834   6/2006
CN   1825415   8/2006
(Continued)

OTHER PUBLICATIONS

Office Action for co-pending U.S. Appl. No. 12/734,044 dated Dec. 7, 2011.
(Continued)

*Primary Examiner* — Bipin Shalwala
*Assistant Examiner* — Ryan A Lubit
(74) *Attorney, Agent, or Firm* — Harness, Dickey & Pierce, P.L.C.

(57) ABSTRACT

A display driving circuit of the present invention includes: a source driver (20) which outputs a source signal; a gate driver (30) which outputs a gate signal for turning on a switching element on a row; and a CS driver (40) which outputs a CS signal (CSOUT) whose electric potential is switched in a predetermined direction (low to high or high to low) in accordance with a polarity of the source signal. A CS driver (CSn) on an n-th row outputs a CS signal (CSOUT) to the n-th row in accordance with a gate signal (GLn) for the n-th row outputted from a gate driver (Gn) provided on the n-th row. This makes it possible to provide a display driving circuit which enables CC driving with a simple configuration.

17 Claims, 27 Drawing Sheets

(56) References Cited

U.S. PATENT DOCUMENTS

| | | | |
|---|---|---|---|
| 5,337,173 | A | 8/1994 | Atsumi et al. |
| 5,694,061 | A | 12/1997 | Morosawa |
| 5,701,136 | A | 12/1997 | Huq |
| 5,872,481 | A | 2/1999 | Sevic et al. |
| 5,974,041 | A | 10/1999 | Kornfeld et al. |
| 6,052,426 | A | 4/2000 | Maurice |
| 6,064,713 | A | 5/2000 | Lebrun |
| 6,137,315 | A | 10/2000 | Zettler |
| 6,198,342 | B1 | 3/2001 | Kawai |
| 6,225,866 | B1 | 5/2001 | Kubota |
| 6,522,187 | B1 | 2/2003 | Sousa |
| 7,176,746 | B1 | 2/2007 | Wang et al. |
| 7,518,407 | B2 | 4/2009 | Nonaka |
| 7,817,770 | B2 | 10/2010 | Chang et al. |
| 7,983,379 | B2 | 7/2011 | Ieong et al. |
| 8,031,160 | B2 | 10/2011 | Chen et al. |
| 8,059,780 | B2 | 11/2011 | Wang et al. |
| 2002/0084969 | A1 | 7/2002 | Ozawa |
| 2002/0167054 | A1 | 11/2002 | Chang et al. |
| 2004/0141273 | A1 | 7/2004 | Le |
| 2004/0155242 | A1 | 8/2004 | Segawa et al. |
| 2004/0253781 | A1 | 12/2004 | Kimura |
| 2005/0122087 | A1 | 6/2005 | Sakai |
| 2006/0001637 | A1 | 1/2006 | Pak et al. |
| 2006/0103429 | A1 | 5/2006 | Nonaka |
| 2006/0132418 | A1 | 6/2006 | Morita |
| 2006/0152460 | A1* | 7/2006 | Toyozawa et al. .............. 345/98 |
| 2006/0187164 | A1 | 8/2006 | Okuno |
| 2006/0208991 | A1 | 9/2006 | Uekuri et al. |
| 2006/0227096 | A1 | 10/2006 | Fujita |
| 2007/0109288 | A1 | 5/2007 | Kida |
| 2007/0132686 | A1 | 6/2007 | Kimura |
| 2007/0188431 | A1* | 8/2007 | Sato et al. ....................... 345/90 |
| 2007/0217564 | A1 | 9/2007 | Tobita |
| 2008/0056430 | A1 | 3/2008 | Chang et al. |
| 2008/0101529 | A1 | 5/2008 | Tobita |
| 2008/0218620 | A1* | 9/2008 | Atlas et al. .................... 348/308 |
| 2012/0170707 | A1 | 7/2012 | Hsu et al. |

FOREIGN PATENT DOCUMENTS

| | | |
|---|---|---|
| CN | 101038792 | 9/2007 |
| EP | 1 199 802 | 4/2002 |
| EP | 1 600 935 | 11/2005 |
| EP | 1 724 784 | 11/2006 |
| EP | 1 780 583 | 5/2007 |
| EP | 1 860 639 | 11/2007 |
| JP | 07-283662 | 10/1995 |
| JP | 08-23238 | 1/1996 |
| JP | 08-263028 | 10/1996 |
| JP | 09-246936 | 9/1997 |
| JP | 10-039277 | 2/1998 |
| JP | 3092506 | 9/2000 |
| JP | 2001-083943 | 3/2001 |
| JP | 2004-222256 | 8/2004 |
| JP | 2005-092783 | 4/2005 |
| JP | 2006-127751 | 5/2006 |
| JP | 2006-148269 | 6/2006 |
| JP | 2006-178072 | 7/2006 |
| JP | 2006-220947 | 8/2006 |
| JP | 2006-277789 | 10/2006 |
| JP | 2006-313319 | 11/2006 |
| JP | 2007-047703 | 2/2007 |
| RU | 2 175 809 | 11/2001 |
| RU | 2 221 286 | 1/2004 |
| WO | WO 2009/034749 | 3/2009 |
| WO | WO 2009/034750 | 3/2009 |
| WO | WO 2009/084267 | 7/2009 |
| WO | WO 2009/084271 | 7/2009 |

OTHER PUBLICATIONS

Abstract of JP 9246936 published on Sep. 19, 1997.
Notice of Allowance for corresponding Russian patent application No. 2010123377 mailed Jul. 15, 2011 (with English translation).
Office Action for corresponding U.S. Appl. No. 12/734,044 dated Apr. 13, 2012.
Advisory Action for corresponding U.S. Appl. No. 12/734,044 dated Jul. 13, 2012.
Office Action for co-pending U.S. Appl. No. 12/734,376 dated Mar. 7, 2013.
Notice of Allowance for co-pending U.S. Appl. No. 12/734,044 dated Nov. 13, 2012.
Election of Species Requirement for co-pending U.S. Appl. No. 12/734,595 dated Apr. 30, 2013.
Office Action from co-pending U.S. Appl. No. 12/734,595 dated Jul. 11, 2013.
Notice of Allowance from co-pending U.S. Appl. No. 12/734,376 dated Jul. 12, 2013.

* cited by examiner

PRIOR ART

PRIOR ART

PRIOR ART

PRIOR ART

DISPLAY DRIVING CIRCUIT HAVING A MEMORY CIRCUIT, DISPLAY DEVICE, AND DISPLAY DRIVING METHOD

TECHNICAL FIELD

The present invention relates to a display driving circuit and a display driving method for driving a display panel, such as an active matrix liquid crystal display panel, which includes scan signal lines, data signal lines, pixel electrodes, switching elements, and capacity coupling lines, wherein the scan signal lines turn on and off the switching elements corresponding thereto, and each of the switching elements has (i) one terminal connected with one of the respective pixel electrodes and (ii) another terminal connected with one of the respective data signal lines, and the capacity coupling lines are capacity-coupled with corresponding ones of the pixel electrodes, wherein each of the scan signal lines forms a row together with switching elements connected thereto, pixel electrodes respectively connected to these switching elements, and one of the capacity coupling lines capacity-coupled with these pixel electrodes.

BACKGROUND ART

Conventionally, a driving method called "CC (Charge Coupling) driving" is used in an active matrix liquid crystal display device. The CC driving is disclosed, for example, in Patent Literature 1. The following describes the CC driving with reference to descriptions disclosed in Patent Literature 1.

FIG. 24 is an equivalent circuit diagram illustrating a structure of a device for carrying out the CC driving. FIG. 25 is a timing chart illustrating operating waveforms of various signals in the CC driving.

As shown by the equivalent circuit illustrated in FIG. 24, a liquid crystal display device which carries out the CC driving includes an image display section 110 which includes: a plurality of source lines (signal lines) 101; a plurality of gate lines (scan lines) 102 which intersect with the plurality of source lines 101 at right angles; switching elements 103 respectively provided near to each of the intersections; pixel electrodes 104 respectively connected to the switching elements 103; a plurality of CS (Capacity Storage) bus lines (common electrode lines) 105 which are respectively paired with the plurality of gate lines 102, and are aligned in parallel with each of the plurality of gate lines 102; storage capacitors 106 provided between the pixel electrodes 104 and the plurality of CS bus lines 105; a counter electrode 109; and a liquid crystal 107 provided between the pixel electrode 104 and the common electrode 109.

Each switching element 103 is formed from amorphous silicon (a-Si), polycrystalline polysilicon (p-Si), monocrystalline silicon (c-Si), or the like. Further, the switching element 103 has a structure in which a capacitor 108 is formed between a gate and a drain. Due to the capacitor 108, a phenomenon is occurred in which an electric potential of the pixel electrode 104 is shifted to a negative side by a gate pulse supplied via the gate line 102.

Further, the liquid crystal display device includes, outside of the image display section 110: a source line driving circuit 111 (source driver) which drives the source lines 101; a gate line driving circuit 112 (gate driver) which drives the gate lines 102; and a CS driving circuit 113 (CS driving circuit) which drives the CS bus line 105.

FIG. 25 shows operating waveforms of various signals in the liquid crystal display device. A waveform Wg of a gate line 102 is at a voltage Von only during an H-period (horizontal scan period) during which the gate line 102 is being selected. During the other periods, the waveform Wg maintains at a voltage Voff. A waveform Ws of a source line 101 is inverted in polarity in every H-period and, on an identical gate line 102, polarities are alternated in every H-period (line inversion driving). Note that, the polarities are inverted with amplitude which differs in accordance with a signal of video to be displayed. However, in FIG. 25, amplitude of the waveform Ws is constant based on the assumption that a uniform video signal is supplied.

In the period during which the waveform Wg is being at the voltage Von, the switching element 103 is being conductive, whereby a waveform Wd of the pixel electrode 104 has a same electric potential as that of the waveform Ws of the source line 101 during the period. Whereas, when the waveform Wg is turned to be at the voltage Voff, a voltage of the waveform Wd is slightly shifted to the negative side due to the capacitor 108 between the gate and the drain.

A waveform Wc of the CS bus line 105 is at a voltage Ve+ during (i) an H-period during which a corresponding gate line 102 is being selected and (ii) the next H-period. In a H-period after the next, the voltage Ve+ is switched to Ve−, and then the voltage Ve− is maintained until a next field. The switch of the voltage shifts a voltage of the waveform Wd of the pixel electrode 104 to the negative side due to the storage capacitor 106.

As a result, the waveform Wd of the pixel electrode 104 obtains large amplitude than that of the waveform Ws of the source line 101. This allows the waveform Ws of the source line 101 to have smaller amplitude. The configuration gives the source line driving circuit 111 a simplified circuit structure and reduced power consumption.

Patent Literature 1

Japanese Patent Application Publication, Tokukai, No. 2001-83943 A (Publication Date: Mar. 30, 2001)

SUMMARY OF INVENTION

The following describes a structure of a conventional general CS driving circuit. The following describes a gate/CS driving circuit in which a CS driving circuit and a gate line driving circuit are integrated. Note however that, the CS driving circuit and the gate line driving circuit can be provided separately. FIG. 26 is a block diagram illustrating a schematic structure of a liquid crystal display device which includes a general gate/CS driving circuit. FIG. 27 is a timing chart illustrating waveforms of various signals which are inputted to or outputted from the gate/CS driving circuit.

The gate/CS driving circuit includes a gate line driving circuit and a CS driving circuit which are integrated together. In FIG. 26 illustrating the gate/CS driving circuit, a left block of the diagram functions as the gate line driving circuit 112, and a right block of the diagram functions as the CS driving circuit 113. Further, the gate line driving circuit 112 and the CS driving circuit 113 are provided so as to deal with each of the rows. For convenience of explanations, hereinafter, a gate line driving circuit 112 at an n-th row and a CS driving circuit 113 at the n-th row are indicated by Gn and CSn, respectively. Note that a row (line) next to the n-th row in a scanning direction (a downward direction in FIG. 26) is referred to as an (n+1)th row, and a row previous to the n-th row, that is, a row opposite the (n+1)th row is referred to as an (n−1)th row.

The following describes the various signals shown in FIGS. 26 and 27. The gate line driving circuit 112 includes inside a shift register (not illustrated). A signal supplied from a shift register on the n-th row is indicated by SROn, and a signal (gate signal) supplied to a gate line on the n-th row is indicated by GLn. Note that the signal GLn is a signal which is produced from the signal SROn which has passed through a buffer, whereby the signal GLn has a same waveform as that of the signal SROn. Gate clocks GCK1 and GCL2 are supplied from a control circuit (not illustrated) and define operation timing of shift registers. Clocks CK and CKB are signals which correspond to the gate clocks GCK1 and GCL2, respectively, and are supplied to a gate line driving circuit 112 on each of the rows. Note that a single horizontal scan period (1H) is defined by (i) a period from a rising edge of the clock CK to a rising edge of the clock CKB, or (ii) a period from the rising edge of the clock CKB to a rising edge of the clock CK.

The CS driving circuit 113 includes inside a selection switch (UDSW) 113a and a memory circuit (not illustrated). The selection switch 113a selects whether a gate signal which serves as a timing signal in generating a CS signal on the n-th row is fetched from a gate line driving circuit Gn−1 on the previous row ((n−1)th row) or from a gate line driving circuit Gn+1 on the next row (the (n+1)th row). The selection switch 113a carries out the selection in accordance with switching signals supplied from the control circuit (not illustrated). The switching signals are indicated by UD and UDB and have respective waveforms whose polarities are opposite to each other. In accordance with a gate signal selected by the selection switch 113a and polarity signals CMI and CMIB, the memory circuit outputs a signal LAOn (see FIG. 27) from which a CS signal is produced. The polarity signals CMI and CMIB (i) are supplied from the control circuit to the CS driving circuit 113 and (ii) have respective waveforms whose polarities are opposite to each other. A signal CSOUTn indicates a signal (CS signal) whose electric potential level (level L or level H) is determined based on the signal LAOn. The signal CSOUTn is supplied to a CS bus line on the n-th row.

The following describes operation in outputting a CS signal from the CS driving circuit CSn on the n-th row, with reference to the timing chart in FIG. 27. The following describes a case where (i) the selection switch 113a selects a gate signal GLn+1 of the gate line driving circuit Gn+1 on the (n+1)th row in accordance with a switching signal supplied from the control circuit, and then (ii) the signal GLn+1 is supplied to the CS driving circuit CSn.

First, at timing of the rising edge of the clock CK, the gate signal GLn is supplied from the gate line driving circuit (Gn) on the n-th row to a gate line on the n-th row. Then, after a lapse of a period 1H, that is, at timing of the rising edge of the clock CKB, the gate signal GLn+1 is supplied from the gate line driving circuit (Gn+1) on the (n+1)th row. At the same time, the gate signal GLn+1 is supplied to the memory circuit of the CS driving circuit CSn. The memory circuit 113 is made up of, for example, a D-latch circuit. The memory circuit receives (i) the polarity signal CMIB as input data (D=terminal) and (ii) the signal GLn+1 as an input clock (CK terminal). Further, in accordance with an output signal LAOn supplied from the memory circuit, an electric potential level (level L or level H) of the signal CSOUTn is determined by an analogue switch (not illustrated), and then the signal CSOUT whose potential level has been thus determined is supplied as a signal CSOUTn to the CS bus line.

As described above, according to the CS driving circuit of the conventional liquid crystal display device, a gate signal on the (n+1)th row or the (n−1)th row is used for generating a CS signal which is to be supplied from a CS driving circuit on the n-th row. Accordingly, a selection switch (UDSW) is required for selecting a row (the (n+1)th row or the (n−1)th row) adjacent to the row (the n-th row) on which the CS signal is generated. Further, wires are required for transmitting (i) a signal for controlling the selection switch and (ii) a gate signal from the adjacent row (the (n+1)th row or the (n−1)th row) to the row (n-th row). Such a configuration (i) causes a structure of the CS driving circuit to be complicated, (ii) influences a size of the whole liquid crystal display device, and (iii) prevents space-saving of a region other than a display panel. As a result, a cost of the liquid crystal display device would be increased.

The present invention is accomplished in view of the problems, and its object is to provide a display driving circuit and a display driving method for carrying out a CC driving with a simple structure.

In order to attain the object, the display driving circuit of the present invention drives a display panel which includes scan signal lines, data signal lines, pixel electrodes, switching elements, and capacity coupling lines, wherein the scan signal lines turn on and off the switching elements corresponding thereto, and each of the switching elements has (i) one terminal connected with one of the respective pixel electrodes and (ii) another terminal connected with one of the respective data signal lines, and the capacity coupling lines are capacity-coupled with corresponding ones of the pixel electrodes, wherein each of the scan signal lines forms a row together with switching elements connected thereto, pixel electrodes respectively connected to these switching elements, and one of the capacity coupling lines capacity-coupled with these pixel electrodes, the display driving circuit driving the display panel to carry out a gradation display in accordance with electric potentials of the pixel electrodes, the display driving circuit comprising: a scan signal line driving circuit for driving the scan signal lines; a data signal line driving circuit for outputting a data signal which is based on a video signal; and a capacity coupling line driving circuit for outputting a potential shift signal whose electric potential is switched over in a certain way in accordance with a polarity of the data signal, for each row, the capacity coupling line driving circuit outputting a potential shift signal to a row in accordance with an output signal outputted to the row from the scan signal line driving circuit.

The display panel driven by the display driving circuit has the above described configuration; According to a typical arrangement, for example, a plurality of pixel electrodes are arranged in a matrix manner in which (i) scan signal lines, switching elements, and capacity coupling lines are arranged along a row direction, and (ii) data signal lines are arranged along a column direction. Note that, in the typical arrangement, the terms "row" and "column", or the terms "horizontal" and "vertical" often indicate a lateral direction and a longitudinal direction, respectively, in the display panel. However, the directions are not necessarily interpreted as described above, but the lateral-longitudinal relation can be interpreted reversely. Therefore, the terms "row", "column", "horizontal", and "vertical" in the present invention do not limit the directions in particular.

The display driving circuit for driving the display panel can have a configuration in which, for example, a horizontal scan period is assigned to each row or a plurality of rows in turn, a switching element provided on any one of the rows is turned on in accordance with a scan signal during the horizontal scan period, and then an electric potential in accordance with a data signal is supplied to a pixel electrode connected to the switching element thus turned on.

Moreover, the display driving circuit shifts, with use of a potential shift signal, electrical potential of a pixel electrode which is capacity-coupled with a capacity coupling line. The potential shift signal has an electric potential which switches, for example, after a horizontal scan period of each of the rows. Directions of the switching (a low level to a high level, or the high level to the low level) are determined in accordance with a polarity of a data signal in a horizontal scan period of each of the rows. With the configuration, so-called CC driving can be realized.

According to such CC driving as described above, generally, when a CS signal (a potential shift signal) which is to be outputted from a capacity coupling line driving circuit (a CS driving circuit) on an n-th row is generated, a scan signal (a gate signal) on an adjacent row is taken in. Accordingly, a structure of the circuit becomes complicated because of necessity of a selection switch (UDSW) and the like.

On the other hand, according to the display driving circuit of the present invention, a potential shift signal is outputted to a row by the capacity coupling line driving circuit in accordance with an output signal outputted to the row from the scan signal line driving circuit. That is, for example, a potential shift signal (a CS signal) supplied to a capacity coupling line (a CS bus line) on an n-th row is generated in accordance with a scan signal (a gate signal) outputted to a scan signal line (a gate line) on the n-th row. Accordingly, a scan signal line to which a scan signal is supplied is not necessary to be selected, whereby a selection switch, which is conventionally required, is not required. This allows a structure of the capacity coupling line driving circuit to be simplified. Therefore, according to the display driving circuit, CC driving can be carried out with a simple structure.

Note that the capacity coupling line driving circuit of the present invention has a configuration in which a potential shift signal is outputted to a row in accordance with an output signal outputted to the row from the scan signal line driving circuit. However, the output signal is not limited to a scan signal but can be, for example, a setting signal outputted to another stage (e.g., a next stage) from a shift register of the scan signal line driving circuit.

The display driving circuit can be a circuit made up of, for example, a single channel transistor, whereby a structure of the circuit can be further simplified. Therefore, in a case where the display driving circuit is made up of the single channel transistor, it is possible to bring about an especially advantageous effect.

In the display driving circuit of the present invention, it is preferable that the capacity coupling line driving circuit outputs the potential shift signal after at least a single horizontal scan period has passed from when the output signal is outputted from the scan signal line driving circuit.

According to the configuration, the potential shift signal is outputted after at least a single horizontal scan period has passed from when the output signal is outputted from the scan signal line driving circuit. This makes it possible to certainly carry out CC driving.

In the display driving circuit of the present invention, it is preferable that the capacity coupling line driving circuit includes a transfer circuit for securing at least a single horizontal period between when the output signal is outputted from the scan signal line driving circuit and when the potential shift signal is outputted.

In the configuration, a potential shift signal can be outputted after at least a single horizontal scan period has passed.

In the display driving circuit of the present invention, it is preferable that the capacity coupling line driving circuit includes: a memory circuit which (i) stores a first signal corresponding to change of a potential level of the output signal outputted from the scan signal line driving circuit and (ii) outputs the first signal to the transfer circuit, the transfer circuit which outputs a second signal which is derived from the first signal with at least a single horizontal scan period, the first signal being outputted from the memory circuit, and a switch circuit which generates the potential shift signal based on a potential level of the second signal outputted from the transfer circuit.

According to the configuration, in accordance with an output signal outputted to a row from the scan signal line driving circuit, a potential shift signal can be outputted to the row after at least a single horizontal scan period has passed from when the output signal is outputted.

In the display driving circuit of the present invention, it is preferable that the memory circuit includes a first transistor having (i) a first electrode which receives a first input signal and (ii) a control electrode which receives the output signal outputted from the scan signal line driving circuit, a first capacitor element provided between a second electrode of the first transistor and a reference power supply line through which a reference voltage is supplied, a second transistor having (i) a first electrode which receives a second input signal and (ii) a control electrode connected to the control electrode of the first transistor, and a second capacitor element provided between a second electrode of the second transistor and the reference power supply line through which the reference voltage is supplied; the transfer circuit includes a third transistor having (i) a first electrode connected to the second electrode of the first transistor and (ii) a control electrode which receives a clock signal, and a fourth transistor having (i) a first electrode connected to the second electrode of the second transistor and (ii) a control electrode which receives the clock signal; and the switch circuit includes a fifth transistor having (i) a control electrode connected to a second electrode of the third transistor, (ii) a first electrode connected to an output terminal, and (iii) a second electrode which receives a first power supply voltage, and a sixth transistor having (i) a control electrode connected to a second electrode of the fourth transistor, (ii) a first electrode connected to the output terminal, and (iii) a second electrode which receives a second power supply voltage.

According to the configuration, the capacity coupling line driving circuit can be made up of a single channel circuit (N-channel or P-channel). This makes it possible to simplify the structure of the circuit, as compared to, for example, a circuit made up of a CMOS.

In the display driving circuit of the present invention, it is preferable that the capacity coupling line driving circuit causes a potential level of the first signal to be changed from a first potential level to a second potential level when a potential level of the output signal outputted from the scan signal line driving circuit is changed from the first potential level to the second potential level, the second potential level being a potential level at which a transistor is turned on, the capacity coupling line driving circuit outputs the second signal derived from the first signal, after the third transistor is turned on in response to a change in a potential level of the clock signal, and the capacity coupling line driving circuit outputs, as the potential shift signal, a signal at a potential level of the first power supply voltage, at a time when the potential level of the second signal is changed from the first potential level to the second potential level.

The first potential level is a potential level at which a transistor is turned off. The second potential level is a potential level at which a transistor is turned on. More specifically, in a case of an N-channel type MOS transistor, the first potential level represents a low (L) level (VSS) and the second potential level represents a high (H) level (VDD). Note that, in a case of a P-channel type MOS transistor, the first potential level represents the high (H) level (VDD) and the second potential level represents the low (L) level (VSS).

According to the configuration, it is possible to output a potential shift signal on a positive polarity side.

In the display driving circuit of the present invention, it is preferable that the capacity coupling line driving circuit causes a potential level of the first signal to be changed from a second potential level to a first potential level when a potential level of the output signal outputted from the scan signal line driving circuit is changed from the first potential level to the second potential level, the second potential level being a potential level at which a transistor is turned on, the capacity coupling line driving circuit outputs the second signal derived from the first signal, after the fourth transistor is turned on in response to a change in a potential level of the clock signal, and the capacity coupling line driving circuit outputs, as the potential shift signal, a signal at a potential level of the second power supply voltage, at a time when the potential level of the second signal is changed from the first potential level to the second potential level.

According to the configuration, it is possible to output a potential shift signal on a negative polarity side.

In the display driving circuit of the present invention, it is preferable that the capacity coupling line driving circuit further includes a booster circuit which (i) increases a potential level of the first signal outputted from the memory circuit and (ii) supplies, to the transfer circuit, the first signal whose potential level is thus increased.

According to the configuration, a potential level of a signal supplied to the transfer circuit can be increased. This makes it possible to restrain threshold decrease caused due to a writing characteristic of a transistor, whereby a stable electric potential can be supplied to the switch circuit. Accordingly, a stable potential shift signal can be outputted.

In the display driving circuit of the present invention, it is preferable that the memory circuit includes a first transistor having (i) a first electrode which receives a first input signal and (ii) a control electrode which receives the output signal outputted from the scan signal line driving circuit, a first capacitor element provided between a second electrode of the first transistor and a reference power supply line through which a reference voltage is supplied, a second transistor having (i) a first electrode which receives a second input signal and (ii) a control electrode connected to the control electrode of the first transistor, and a second capacitor element provided between a second electrode of the second transistor and the reference power supply line through which the reference voltage is supplied; the booster circuit includes a seventh transistor having (i) a first electrode which receives a predetermined voltage at a second potential level at which a transistor is turned on and (ii) a control electrode connected to the second electrode of the first transistor, a third capacitor element provided between the control electrode of the seventh transistor and a clock signal line through which a clock signal is supplied, an eighth transistor having (i) a first electrode which receives a predetermined voltage at the second potential level and (ii) a control electrode connected to the second electrode of the second transistor, a fourth capacitor element provided between the control electrode of the eighth transistor and the clock signal line through which the clock signal is supplied; the transfer circuit includes a third transistor having (i) a first electrode connected to a second electrode of the seventh transistor and (ii) a control electrode which receives the clock signal, and a fourth transistor having (i) a first electrode connected to a second electrode of the eighth transistor and (ii) a control electrode which receives the clock signal; and the switch circuit includes a fifth transistor having (i) a control electrode connected to a second electrode of the third transistor, (ii) a first electrode connected to an output terminal, and (iii) a second electrode which receives a first power supply voltage, and a sixth transistor having (i) a control electrode connected to a second electrode of the fourth transistor, (ii) a first electrode connected to the output terminal, and (iii) a second electrode which receives a second power supply voltage.

According to the configuration, a stable potential shift signal can be outputted with a simple structure.

In the display driving circuit of the present invention, it is preferable that the capacity coupling line driving circuit further includes a refresh circuit which causes (i) a potential level of the first signal outputted from the memory circuit to be increased every single horizontal scan period or less frequently than every single horizontal scan period, and (ii) the potential level of the first signal to be maintained during a period in which the potential level is not increased.

In general, on a transmission path of a signal, there is a tendency that a leakage current is inevitably occurred, whereby the potential level is decreased as time passes. A potential level of the first signal outputted form the memory circuit is gradually decreased due to an effect of the leakage current. Accordingly, a potential level at the beginning of the period 1V differs at the end of the period 1V.

On the other hand, according to the configuration of the capacity coupling line driving circuit, the potential level of the first signal is increased every single horizontal scan period or less frequently than every single horizontal scan period, whereby an effect of decreasing a voltage due to a leakage current can be reduced. Moreover, during the period in which the potential level is not increased, the potential level of the first signal is maintained. Accordingly, the potential level of the first signal can be stabilized, whereby a stable potential shift signal can be outputted.

In the display driving circuit of the present invention, it is preferable that the memory circuit includes a first transistor having (i) a first electrode which receives a first input signal and (ii) a control electrode which receives the output signal outputted from the scan signal line driving circuit, a first capacitor element provided between a second electrode of the first transistor and a reference power supply line through which a reference voltage is supplied, a second transistor having (i) a first electrode which receives a second input signal and (ii) a control electrode connected to the control electrode of the first transistor, and a second capacitor element provided between a second electrode of the second transistor and the reference power supply line through which the reference voltage is supplied; the refresh circuit includes a ninth transistor having (i) a first electrode which receives a predetermined voltage at a second potential level at which a transistor is turned on and (ii) a control electrode connected to the second electrode of the first transistor, a fifth capacitor element provided between a second electrode of the ninth transistor and a clock signal line through which a clock signal is supplied, a tenth transistor having (i) a first electrode which receives the predetermined voltage at the second potential level, (ii) a control electrode connected to a second electrode of the ninth transistor, and (iii) a second electrode connected to the second electrode of the first transistor, an eleventh transistor having (i) a first electrode which receives the predetermined voltage at the second potential level and (ii) a control electrode connected to the second electrode of the second transistor, a sixth capacitor element provided between a second electrode of the eleventh transistor and the clock signal line through which the clock signal is supplied, and a twelfth transistor having (i) a first electrode which receives the predetermined voltage at the second potential level, (ii) a control electrode connected to the second electrode of the eleventh transistor, and (iii) a second electrode connected to the second electrode of the first transistor; the transfer circuit includes a seventh transistor having (i) a control electrode connected to the control electrode of the tenth transistor and (ii) a first electrode which receives the predetermined voltage at the second potential level, a third transistor having (i) a first electrode connected to a second electrode of the seventh transistor and (ii) a control electrode which receives the clock signal, an eighth transistor having (i) a control electrode connected to the control electrode of the twelfth transistor and (ii) a first electrode which receives the predetermined voltage at the second potential level, and a fourth transistor having (i) a first electrode connected to a second electrode of the eighth transistor and (ii) a control electrode which receives the clock signal; and the switch circuit includes a fifth transistor having (i) a control electrode connected to a second electrode of the third transistor, (ii) a first electrode connected to an output terminal, and (iii) a second electrode which receives a first power supply voltage, and a sixth transistor having (i) a control electrode connected to a second electrode of the fourth transistor, (ii) a first electrode connected to the output terminal, and (iii) a second electrode which receives a second power supply voltage.

According to the configuration, a stable potential shift signal can be outputted with a simple structure.

In the display driving circuit of the present invention, it is preferable that the capacity coupling line driving circuit further includes a capacity reduction switch circuit which reduces capacity load on the refresh circuit.

The refresh circuit has capacity load. Accordingly, in a case where the refresh circuit is provided on each of the rows, the clock signal is subjected to great load.

According to the configuration of the present invention, the capacity reduction switch circuit is provided for reducing the capacity load in the refresh circuit. This makes it possible to reduce clock load.

In the display driving circuit of the present invention, it is preferable that the memory circuit includes the first transistor having (i) the first electrode which receives the first input signal and (ii) the control electrode which receives the output signal outputted from the scan signal line driving circuit, the first capacitor element provided between the second electrode of the first transistor and the reference power supply line through which the reference voltage is supplied, the second transistor having (i) the first electrode which receives the second input signal and (ii) the control electrode connected to the control electrode of the first transistor, and the second capacitor element provided between the second electrode of the second transistor and the reference power supply line through which the reference voltage is supplied; the capacity reduction switch circuit includes a sixteenth transistor having (i) a first electrode which receives a clock signal and (ii) a control electrode connected to the second electrode of the first transistor, and a seventeenth transistor having (i) a first electrode which receives the clock signal and (ii) a control electrode connected to the second electrode of the second transistor, the refresh circuit includes the ninth transistor having (i) the first electrode which receives the predetermined voltage at the second potential level, (ii) the second electrode connected to a second electrode of the sixteenth transistor via the fifth capacitor element, and (iii) the control electrode connected to the second electrode of the first transistor, the tenth transistor having (i) the first electrode which receives the predetermined voltage at the second potential level, (ii) the control electrode connected to a second electrode of the ninth transistor, and (iii) the second electrode connected to the second electrode of the first transistor, the eleventh transistor having (i) the first electrode which receives the predetermined voltage at the second potential level, (ii) the second electrode connected to a second electrode of the seventeenth transistor via the sixth capacitor element, and (iii) the control electrode connected to the second electrode of the second transistor, and the twelfth transistor having (i) the first electrode which receives the predetermined voltage at the second potential level, (ii) the control electrode connected to the second electrode of the eleventh transistor, and (iii) the second electrode connected to the second electrode of the second transistor; the transfer circuit includes the seventh transistor having (i) the control electrode connected to the control electrode of the tenth transistor and (ii) the first electrode which receives the predetermined voltage at the second potential level, the third transistor having (i) the first electrode connected to a second electrode of the seventh transistor and (ii) the control electrode which receives the clock signal, the eighth transistor having (i) the control electrode connected to the control electrode of the twelfth transistor and (ii) the first electrode which receives the predetermined voltage at the second potential level, and the fourth transistor having (i) the first electrode connected to the second electrode of the eighth transistor and (ii) the control electrode which receives the clock signal; and the switch circuit includes the fifth transistor having (i) the control electrode connected to the second electrode of the third transistor, (ii) the first electrode connected to the output terminal, and (iii) the second electrode which receives the first power supply voltage, and the sixth transistor having (i) the control electrode connected to the second electrode of the fourth transistor, (ii) the first electrode connected to the output terminal, and (iii) the second electrode which receives the second power supply voltage.

According to the configuration, a transistor is provided as a capacity reduction switch circuit between the clock signal line and the refresh circuit. This prevents the clock signal line and a capacitor element of the refresh circuit from being directly connected with each other. Accordingly, for example, in a case where an input signal at the level L is supplied to the transistor of the capacity reduction switch circuit, the transistor is turned off, whereby the clock signal line can be separated off from the capacitor element. This makes it possible to reduce clock load.

In the display driving circuit of the present invention, it is preferable that the capacity coupling line driving circuit further includes a potential stabilizing circuit which fixes the first potential level of at least one of the first signal and the second signal.

A potential level (level H or level L) is preferable to be stabilized for outputting a stable potential shift signal. However, the first signal and the second signal are floated for a certain period during which the first and second signals are easily affected by noise. Accordingly, it would be possible that the potential level is varied.

On the other hand, according to the configuration of the capacity coupling line driving circuit, a first potential level of at least one of the first signal and the second signal is fixed. For example, the level L of the first signal and the second signal can be fixed. Accordingly, the potential level of at least one of the first signal and the second signal is fixed, whereby a stable potential shift signal can be outputted.

In the display driving circuit of the present invention, it is preferable that the potential stabilizing circuit includes a thirteenth transistor having (i) a first electrode which receives a reference voltage for the first potential level, (ii) a control electrode connected to the second electrode of the second transistor, and (iii) a second electrode connected to the second electrode of the first transistor, and a fourteenth transistor being arranged in parallel with the first transistor and having (i) a first electrode which receives the reference voltage, (ii) a control electrode connected to the second electrode of the first transistor, and (iii) a second electrode connected to the second electrode of the second transistor.

According to the configuration, a first potential level of at least one of the first signal and the second signal can be stabilized with a simple structure.

In the display driving circuit of the present invention, it is preferable that when a signal outputted from the first transistor is changed from a first potential level to a second potential level at which a transistor is turned on, the potential stabilizing circuit stabilizes, at the reference voltage, a potential level of a signal outputted from the second transistor; and when a signal outputted from the second transistor is changed from the first potential level to the second potential level, the potential stabilizing circuit stabilizes, at the reference voltage, a potential level of a signal outputted from the first transistor.

According to the configuration, one of the potential levels (in this case, the first potential level) of the first signal can be stabilized.

In the display driving circuit of the present invention, it is preferable that the capacity coupling line driving circuit further includes a clock booster circuit which (i) increases a potential level of the first signal outputted from the memory circuit and then (ii) supplies the second signal to the switch circuit, the second signal being derived from the first signal whose potential level is thus increased.

According to the configuration, a potential level of a signal to be supplied to the switch circuit can be increased. This makes it possible to restrain threshold decrease caused due to a writing characteristic of a transistor, whereby a stable electric potential can be supplied to the switch circuit. Accordingly, a stable potential shift signal can be outputted.

In the display driving circuit of the present invention, it is preferable that the clock booster circuit includes a fifteenth transistor having (i) a first electrode which receives a reference voltage, (ii) a control electrode which receives an inversion clock signal, and (iii) a second electrode connected to the control electrodes of the third and fourth transistors, and a seventh capacitor element which has (i) one end connected to a clock signal line through which the clock signal is supplied and (ii) the other end connected to the second electrode of the fifteenth transistor.

According to the configuration, a potential level of a signal to be supplied to the switch circuit can be increased with a simple structure.

Note that, the clock booster circuit can be used as a circuit for increasing a potential level of an output signal supplied from the scan signal line driving circuit to the memory circuit (the details are described later).

In the display driving circuit of the present invention, it is preferable that the first electrode of the second transistor and the control electrode of the fifth transistor are connected to each other; and the second signal is supplied, as the second input signal, to the first electrode of the second transistor.

When the first and second transistors are turned on, polarities of the first input signal and the second input signal are opposite to each other. Accordingly, signals (the first signal and the second signal) which are outputted from the transfer switch circuit have respectively different potential levels (e.g., the level H and the level L). Therefore, when one of the signals is at the level H, the other signal is outputted at the level L. This allows potential shift signals to be outputted whose potential levels are alternated in every frame. According to such a configuration, for example, when the first input signal at the level H is supplied to the capacity coupling line driving circuit for generating a potential shift signal at the level H, a signal (the second signal) at the level L is supplied to the fifth transistor of the switch circuit. Then, a second input signal at the level L is required for generating a potential shift signal at the level L.

According to the configuration of the present invention, the second signal is supplied as the second input signal to the first electrode of the second transistor. This allows the levels H and L to be inputted alternately in each frame. Further, a signal line for the second input signal from the control circuit can be omitted, whereby a circuit structure can be simplified.

A display device of the present invention includes any one of the display driving circuits and the display panel.

According to the configuration, it is possible to provide a display device while reducing costs, due to the effect of simplification of a circuit structure of the display driving circuit.

In order to attain the object, a display driving method of the present invention is a method for driving a display panel which includes scan signal lines, data signal lines, pixel electrodes, switching elements, and capacity coupling lines, wherein the scan signal lines turn on and off the switching elements corresponding thereto, and each of the switching elements has (i) one terminal connected with one of the pixel electrodes and (ii) another terminal connected with one of the data signal lines, and the capacity coupling lines are capacity-coupled with corresponding ones of the pixel electrodes, wherein each of the scan signal lines forms a row together with switching element connected thereto, pixel electrodes respectively connected to these switching elements, and one of the capacity coupling lines capacity-coupled with these pixel electrodes, the display panel being driven to carry out a gradation display in accordance with electric potentials of the pixel electrodes, the display driving method comprising the steps of: (a) driving the scan signal line; (b) outputting a data signal which is based on a video signal; and (c) outputting a potential shift signal whose electric potential is switched over in a certain way in accordance with a polarity of the data signal, the step (c), for each row, outputting a potential shift signal to a row in accordance with the output signal outputted to the row in the step (a).

The method can bring about an effect of carrying out CC driving with a simple structure, as with the effect described for the display driving circuit.

Note that the display device of the present invention is preferable to be a liquid crystal display device.

For a fuller understanding of the nature and advantages of the invention, reference should be made to the ensuing detailed description taken in conjunction with the accompanying drawings.

REFERENCE SIGNS LIST

Figure 1:
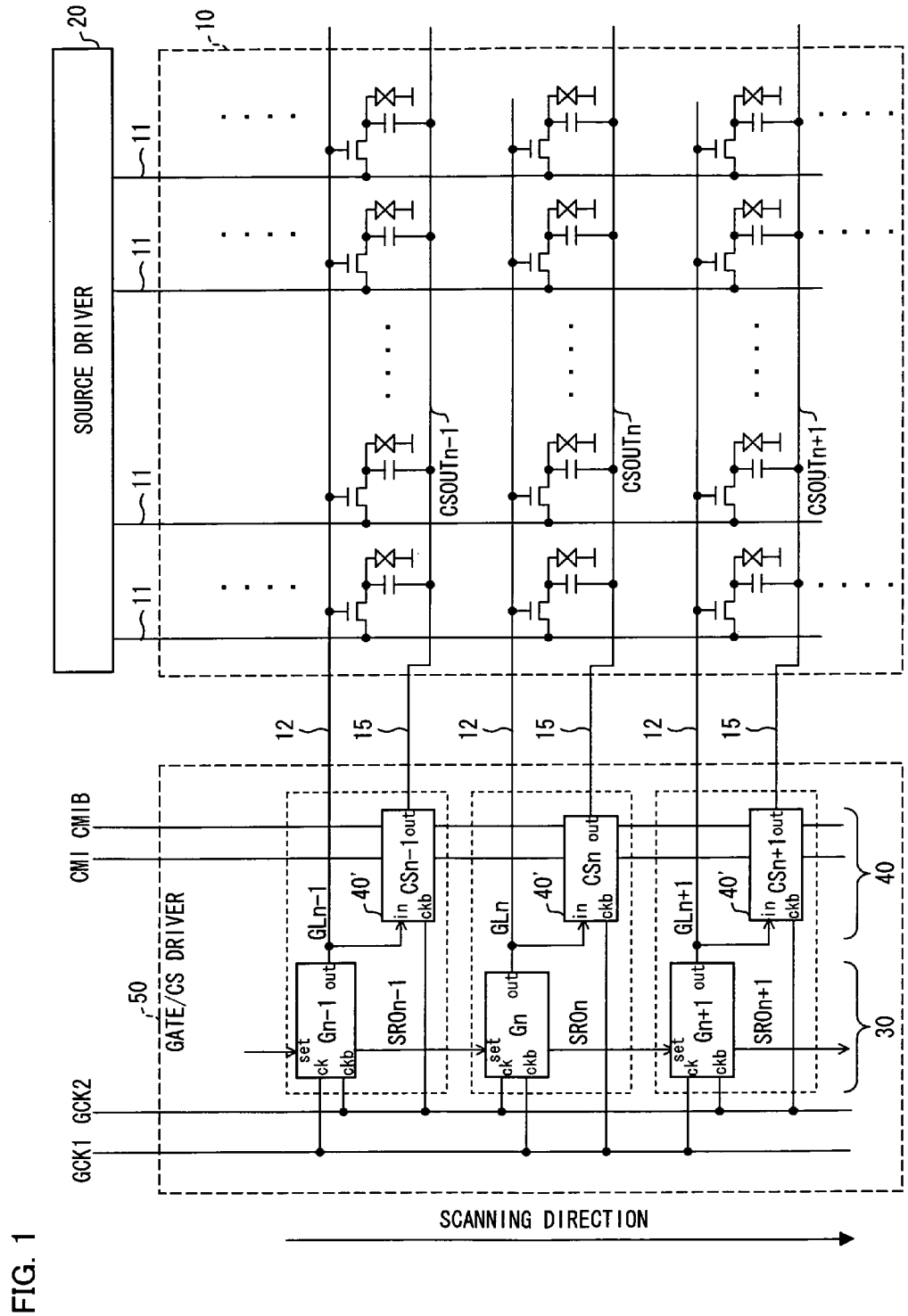
FIG. 1 is a block diagram illustrating a structure of a liquid crystal display device according to an embodiment of the present invention.

1: Liquid crystal display device (display device)
10: Liquid crystal display panel (display panel)
11: Source bus line (data signal line)
12: Gate line (scan signal line)
13: TFT (switching element)
14: Pixel electrode
15: CS bus line (capacity coupling line)
20: Source driver (data signal line driving circuit)
30: Gate driver (scan signal line driving circuit)
40: CS driver (capacity coupling line driving circuit)
41: Memory circuit
42: Transfer switch circuit (transfer circuit)
43: Analogue switch circuit (switch circuit)
44, 45: Stabilizing circuit
46: Booster circuit
47: Refresh circuit
48: Transfer clock booster circuit (clock booster circuit)
**41*a***: Transistor (first transistor)
**41*b***: Transistor (second transistor)
**42*a***: Transistor (third transistor)
**42*b***: Transistor (fourth transistor)
**43*a***: Transistor (fifth transistor)
**43*b***: Transistor (sixth transistor)
**462*a***: Transistor (seventh transistor)
**462*b***: Transistor (eighth transistor)
**471*a***: Transistor (ninth transistor)
**473*a***: Transistor (tenth transistor)
**471*b***: Transistor (eleventh transistor)
**473*b***: Transistor (twelfth transistor)
**44*a***: Transistor (thirteenth transistor)
**44*b***: Transistor (fourteenth transistor)
**48*a***: Transistor (fifteenth transistor)
**41*c***: Capacitor (first capacitor element)
**41*d***: Capacitor (second capacitor element)
**461*a***: Capacitor (third capacitor element)
**461*b***: Capacitor (fourth capacitor element)
**472*a***: Capacitor (fifth capacitor element)
**472*b***: Capacitor (sixth capacitor element)
**48*b***: Capacitor (seventh capacitor element)
474: Transistor (capacity reduction switch circuit)

DESCRIPTION OF EMBODIMENTS

The following describes an embodiment of the present invention with reference to FIGS. 1 through 23.

Figure 2:
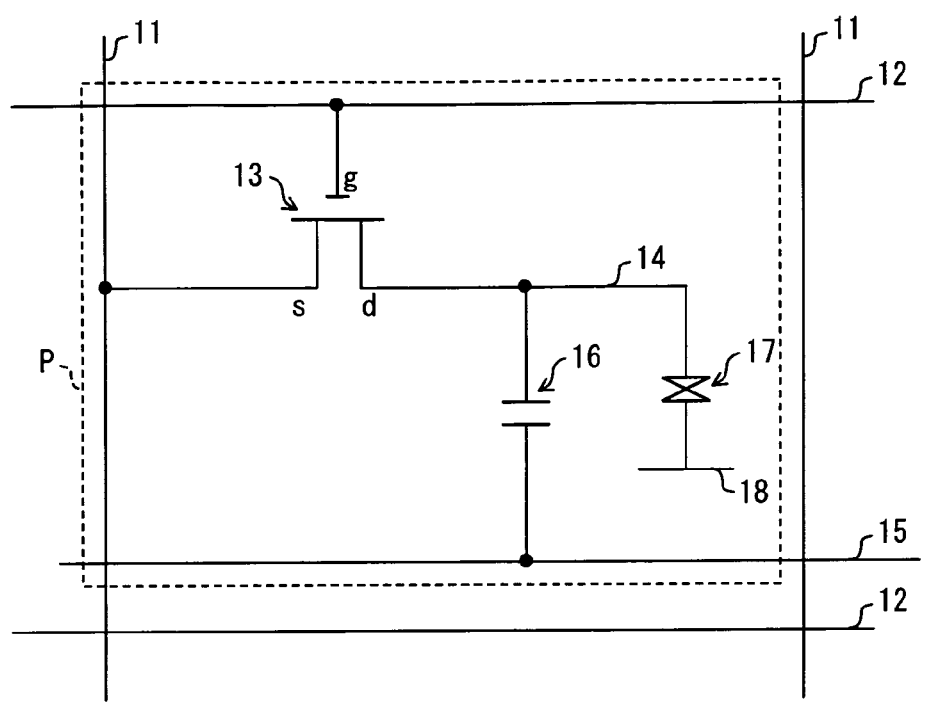
FIG. 2 is an equivalent circuit diagram illustrating an electrical structure of each pixel of the liquid crystal display device shown in FIG. 1.

First, a structure of a liquid crystal display device 1, which is a display device of the present invention, is described with reference to FIGS. 1 and 2. FIG. 1 is a block diagram illustrating a whole structure of the liquid crystal display device 1, and FIG. 2 is an equivalent circuit diagram illustrating an electrical configuration of a pixel of the liquid crystal display device 1.

The liquid crystal display device 1 includes: an active matrix liquid crystal display panel 10 (a display panel); a source driver 20 (a data signal line driving circuit); and a gate/CS driver 50 which includes a gate driver 30 (a scan signal line driving circuit) and a CS driver 40 (a capacity coupling line driving circuit). Further, the liquid crystal display device 1 includes a control circuit (not illustrated) which controls the gate driver 30 and the CS driver 40.

The liquid crystal display panel 10 (i) is made up of an active matrix substrate and a counter substrate between which liquid crystal is provided (not illustrated) and (ii) has a plurality of pixels P (see FIG. 2) which are arranged in a matrix manner.

Further, the liquid crystal display panel 10 includes, on the active matrix substrate: a source bus line 11 (a data signal line); a gate line 12 (a scan signal line); a thin film transistor (hereinafter, referred to as "TFT") 13 (a switching element); a pixel electrode 14 (a pixel electrode); and a CS bus line 15 (a capacity coupling line). Further, the liquid crystal display panel 10 includes a counter electrode 18 on the counter substrate.

The source bus lines 11 are provided in respective columns so as to be in parallel with each other in a column direction (longitudinal direction). The gate lines 12 are provided in respective rows so as to be in parallel with each other in a row direction (transverse direction). Each of the TFT 13 and the pixel electrode 14 is provided so as to correspond to each intersection of the source bus lines 11 and the gate lines 12. The TFT 13 includes a source electrode s, a gate electrode g, and a drain electrode d which are connected to the source bus line 11, the gate line 12, and the pixel electrode 14, respectively. Further, a liquid crystal capacitor 17 is defined by the pixel electrode 14, the common electrode 18, and the liquid crystal provided between the pixel electrode 14 and the common electrode 18.

According to the configuration, a gate signal (scan signal) supplied to the gate line 12 turns on the gate of the TFT 13, and then a source signal (data signal) supplied from the source bus line 11 is written into the pixel electrode 14 so that the pixel electrode 14 has a electric potential corresponding to the source signal. Further, a voltage corresponding to the source signal is applied to the liquid crystal provided between the pixel electrode 14 and the common electrode 18, whereby a gradation display can be carried out in accordance with the source signal.

The CS bus lines 15, respectively paired with the gate lines 12, are provided in respective rows so as to be in parallel with each other in a row direction (transverse direction). The CS bus lines 15 are capacity-coupled with the pixel electrodes 14, respectively, which are provided on the respective rows, whereby a storage capacitor (also called as "auxiliary capacitor") 16 is formed between each pair of the CS bus line 15 and the pixel electrode 14.

The liquid crystal display panel 10 having the above described configuration is driven by the source driver 20, the gate driver 30, CS driver 40, and the control circuit which controls these components.

According to the present embodiment, the rows are scanned in turn by assigning a horizontal scan period to each of the rows in turn so that the horizontal scan period meets an active period (effective scan period) of a vertical scan period which is periodically repeated.

Moreover, in sync with the horizontal scan period of each of the rows, the gate driver 30 sequentially supplies gate signals to gate lines 12 for turning on TFTs 13 provided on the gate lines 12 on the rows.

Moreover, the source driver 20 supplies a source signal to each of the source bus lines 11. The source signal is produced from a video signal which has been (i) supplied to the source driver 20 from outside the liquid crystal display device 1 via the control circuit, (ii) assigned to each of the columns by the source driver 20, and (iii) boosted, and the like. Moreover, for realizing so-called line inversion driving, source signals outputted from the source driver 20 are made to have (i) polarities each of which is inverted in sync with a horizontal scan period of each of the rows and (ii) polarities alternated in adjacent horizontal scan periods on an identical row. For example, polarities of a source signal are inverted between a horizontal scan period on a first row and a horizontal scan period on a second row. Further, polarities of source signals are alternated in every horizontal scan period of a first frame and a second frame on the first row. Note that, in the present embodiment, a line inversion driving method is described as an example just for convenience of explanations. The present invention is not limited to the method but can be applied to, for example, various driving methods such as a frame inversion driving method or a 2H inversion driving method.

The CS driver 40 supplies a CS signal (i.e., potential shift signals of the present invention) to each of the CS bus lines 15. The CS signal has electric polarity which is switched between two values (the electric polarity rises or falls). In sync with an end of a horizontal scan period (1H) on each of the rows, that is, at a time when an active TFT 13 provided on each of the rows is turned off, electric potentials of a CS bus line 15 on each of the rows is switched from one value to the other value. In the present embodiment, for convenience of explanations, it is assumed that electric potentials of the potential shift signal (CS signal) are switched between two values (levels H and L). However, the present invention is not limited to this but can be applied to, for example, a configuration in which electric potentials are switched either among three values or within infinitesimal amplitude. Moreover, timing of the switching does not need to be the same as timing of the end of the horizontal scan period on each of the rows, as long as the timing of the switching is after the horizontal scan period. With the configuration, the CS driver 40 shifts an electric potential of a pixel electrode 14 at a time after a horizontal scan period. Note that, in FIG. 1, a CS driver provided on each of the rows is indicated by a reference numeral "40'", and it is assumed that the CS driver 40 includes the CS driver 40' on each of the rows.

The control circuit controls the gate driver 30, the source driver 20, and the CS driver 40, so that these circuits output a gate signal, a source signal, and a CS signal, respectively.

The CS driver 40 is particularly distinctive among the components included in the liquid crystal display device 1 of the present invention. In short, the CS driver 40 of the present invention generates a CS signal and supplies it to a row in accordance with a gate signal (an output signal from a scan signal line driving circuit) of the row. That is, a CS driver provided on an n-th row (i) takes in a gate signal supplied to a gate line on the n-th row, and then supplies a CS signal to a CS bus line 15 on the n-th row. The following describes details of the CS driver 40. Note that, Example 1 below includes only the above described features. Each of the further Examples 2 through 5 includes other features in addition to the features of Example 1.

Example 1

Figure 3:
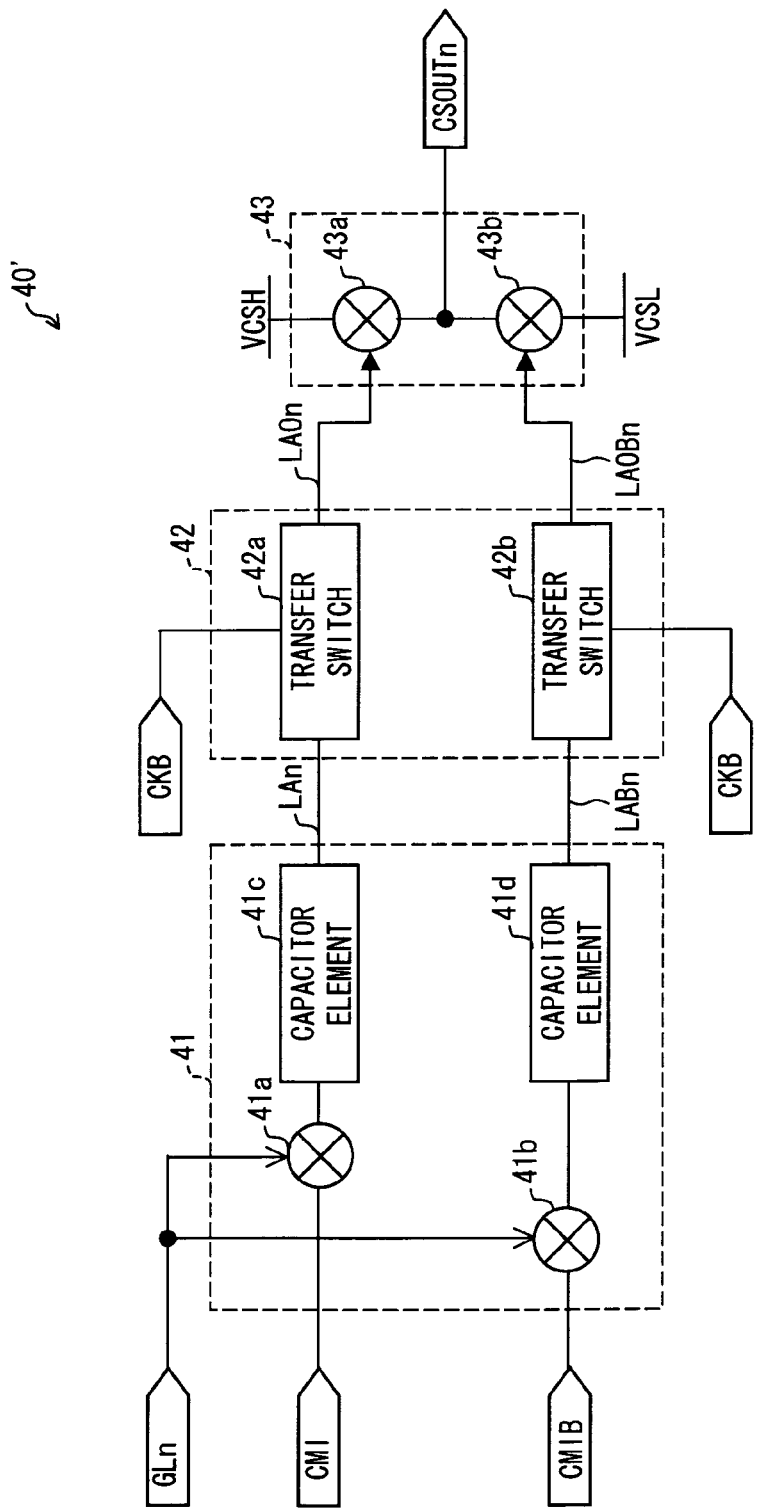
FIG. 3 is a block diagram illustrating a schematic structure of a CS driver according to Example 1.
Figure 4:
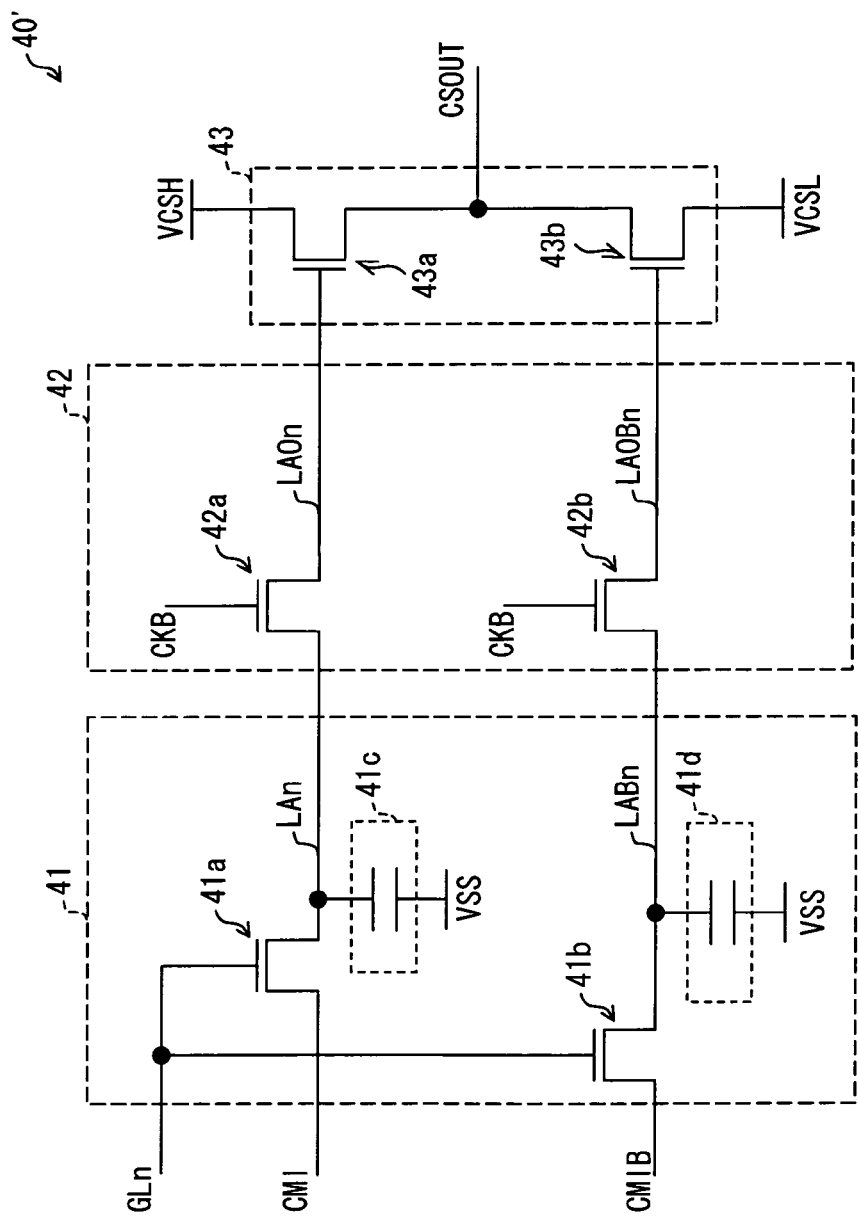
FIG. 4 is a circuit diagram illustrating a structure of the CS driver shown in FIG. 3.
Figure 5:
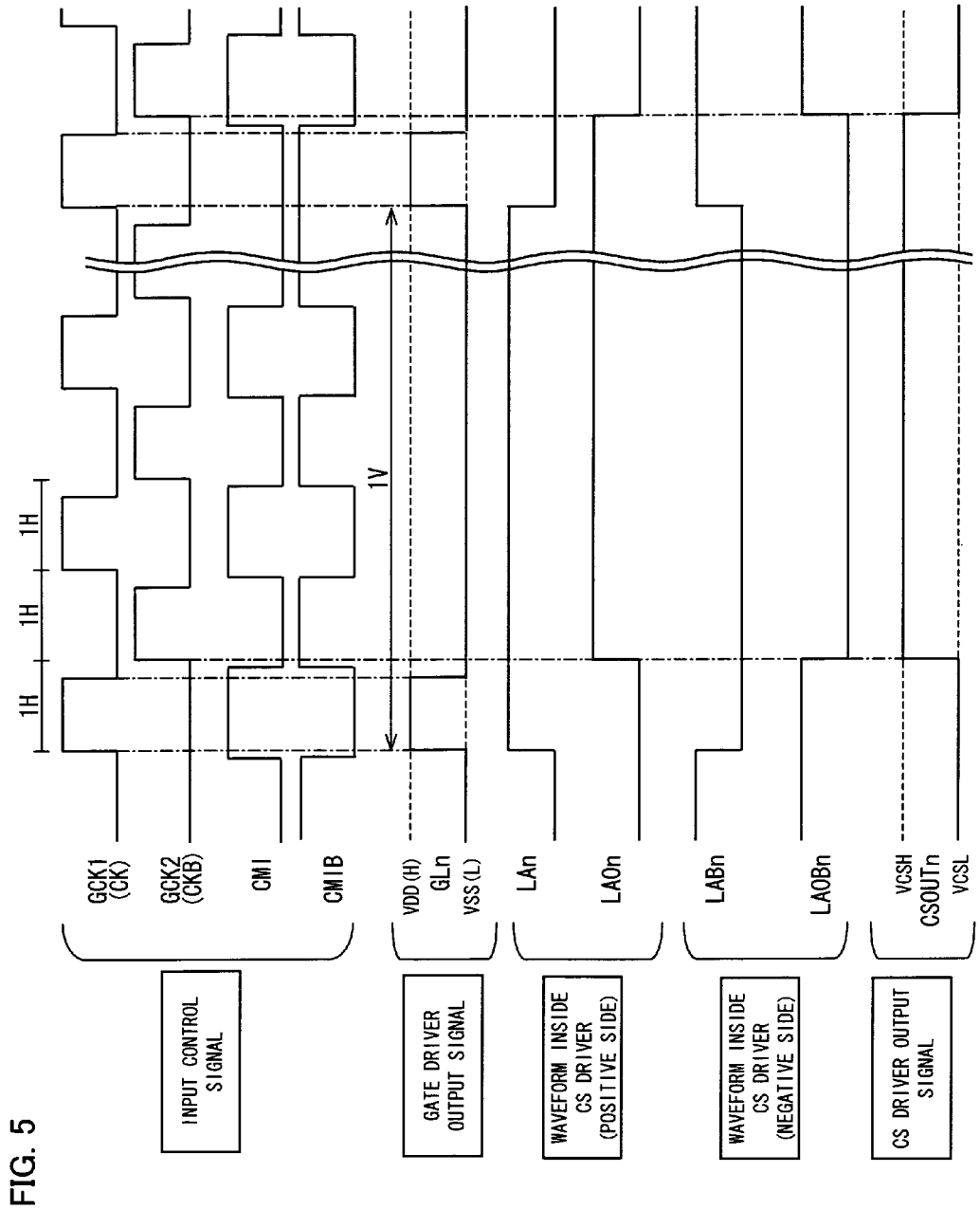
FIG. 5 is a timing chart illustrating waveforms of various signals in the CS driver according to Example 1.

FIG. 3 is a block diagram illustrating a schematic structure of a CS driver 40' according to Example 1. FIG. 4 is a circuit diagram illustrating a detail of the structure. FIG. 5 is a timing chart illustrating waveforms of various signals in the CS driver 40'.

Figure 26:
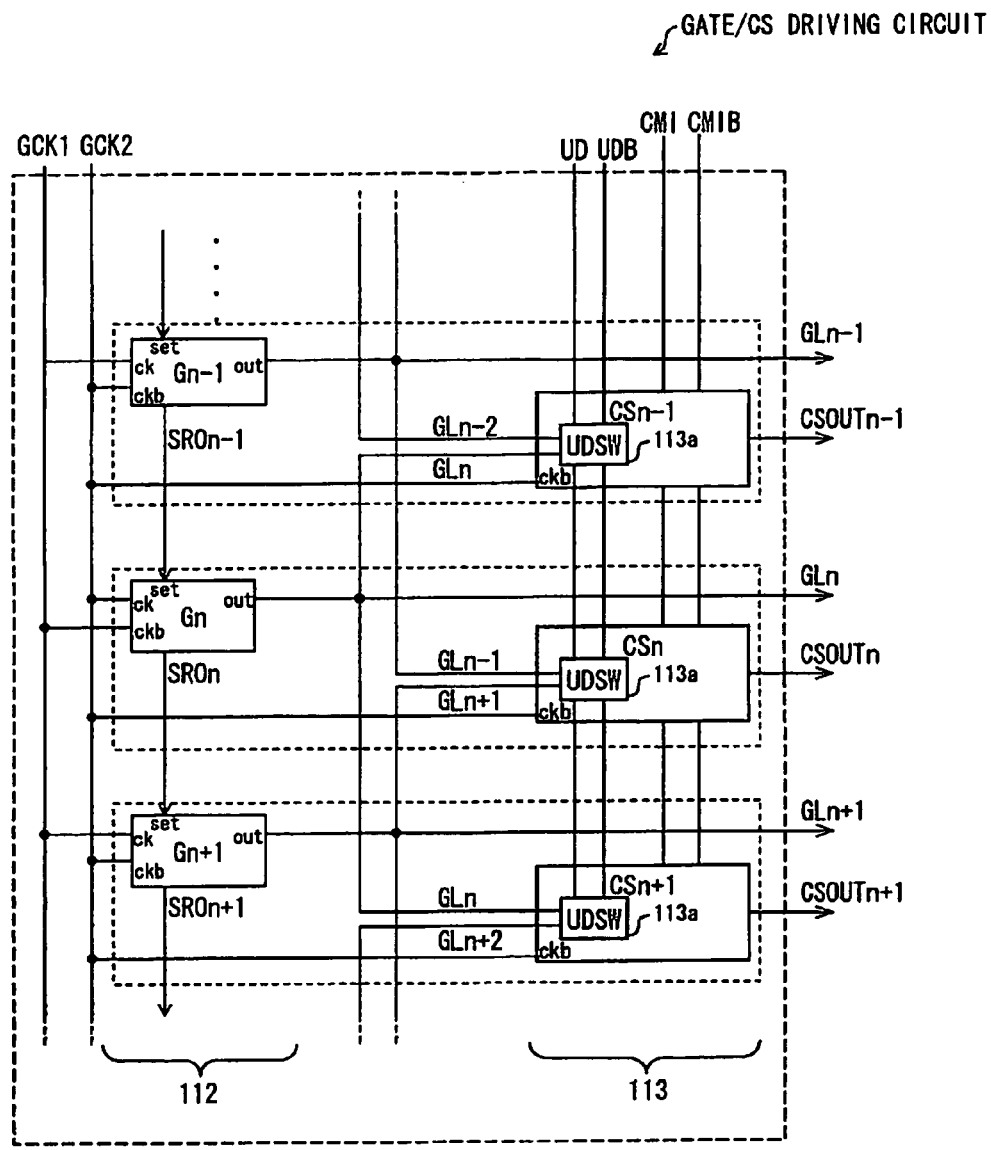
FIG. 26 is a block diagram illustrating a schematic structure of a liquid crystal display device which includes a general gate/CS driving circuit.

The following describes a CS driver 40' on an n-th row as an example. Note that, as with FIG. 26, a gate driver 30 and a CS driver 40' on the n-th row are indicated by Gn and CSn, respectively. A row (line) next to the n-th row in a scanning direction (a downward direction in FIG. 1) is referred to as an (n+1)th row, and a row previous to the n-th row, that is, a row opposite the (n+1)th row is referred to as an (n−1)th row.

Figure 27:
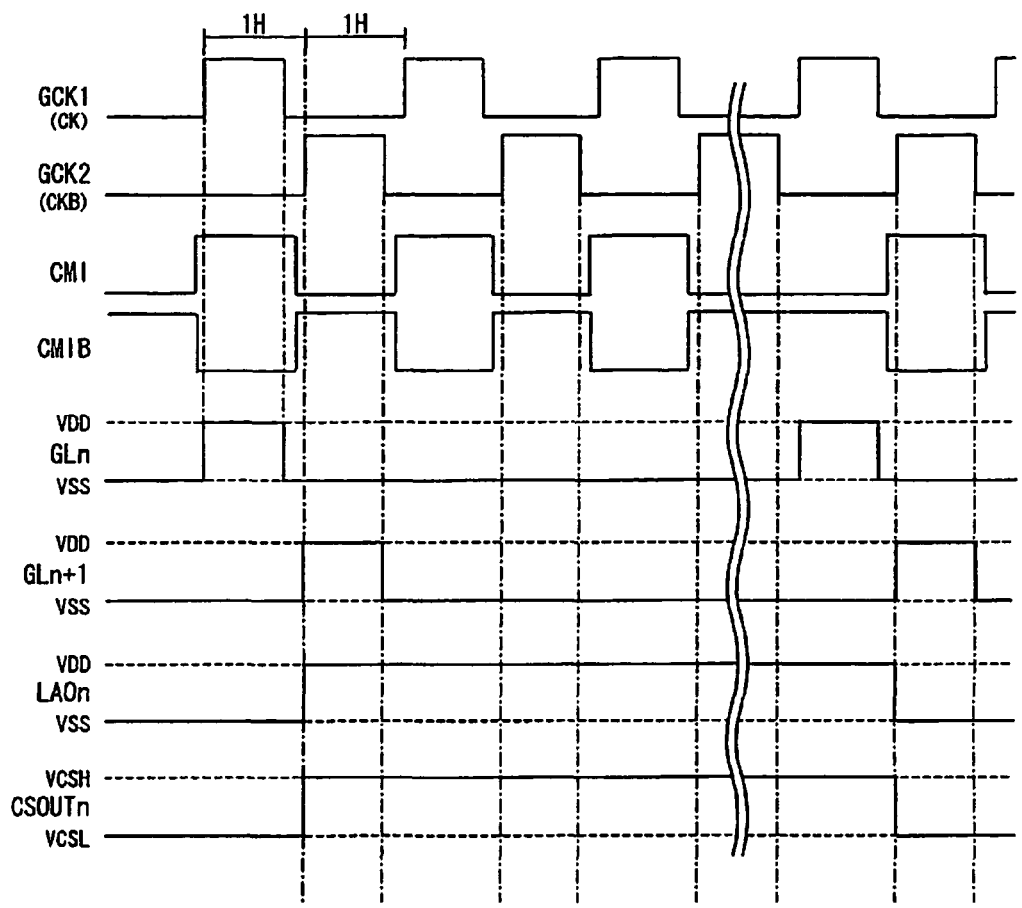
FIG. 27 is a timing chart illustrating waveforms of various signals in the gate/CS driving circuit shown in FIG. 26.

Various signals shown in FIG. 5 are also the same as those in FIG. 27. The gate driver Gn on the n-th row includes inside a shift register (not illustrated). A signal supplied from the shift register is indicated by SROn, and a signal (gate signal) supplied to a gate line on the n-th row is indicated by GLn. Note that the signal GLn is a signal produced from the signal SROn which has passed through a buffer and has a waveform whose pattern accords with changes in potential levels of the signal SROn. Gate clocks GCK1 and GCL2 are supplied from a control circuit and define operation timing of shift registers. Clocks CK and CKB are signals which indicate the gate clocks GCK1 and GCL2, respectively, and are supplied to a gate driver 30 on each of the rows. Note that a single horizontal scan period (1H) is defined by (i) a period from a rising edge of the clock CK to a rising edge of the clock CKB, or (ii) a period from the rising edge of the clock CKB to a rising edge of the clock CK.

As shown in FIG. 1, the CS driver 40' receives the gate signal GLn supplied from the gate driver Gn on the n-th row, the gate clock CKB supplied from the control circuit, and polarity signals CMI (a first input signal), and CMIB (a second input signal). In accordance with the signals, a potential level (level L or level H) of a CS signal CSOUTn is determined, and then the CS signal CSOUTn is supplied to a CS bus line on the n-th row.

As shown in FIGS. 3 and 4, the CS driver 40' includes a memory circuit 41, a transfer switch circuit 42 (transfer circuit), and an analogue switch circuit 43 (switch circuit). The memory circuit 41 includes transistors 41a and 41b (a first transistor and a second transistor) as switching elements, and capacitors 41c and 41d (a first capacitor element and a second capacitor element). The transfer switch circuit 42 includes transistors 42a and 42b (a third transistor and a fourth transistor) as transfer switches. The analogue switch circuit 43 includes transistors 43a and 43b (a fifth transistor and a sixth transistor). Each of the transistors is made up of an N-channel MOS transistor and the CS driver 40' serves as a single channel (N-channel) driving circuit. Note that, as described later (see FIG. 7), each of the transistors can be made up of a P-channel MOS transistor and the CS driver 40' can serve as a P-channel driving circuit. According to the present Example, the memory circuit 41 includes the capacitors 41c and 41d. However, in a case where parasitic capacity of the capacitors 41c and 41d is large, the capacitors 41c and 41d can be omitted. Similarly, the capacitors 41c and 41d can be omitted in the further Examples.

As shown in FIG. 4, the CS driver 40' receives the gate signal GLn on the n-th row, the polarity signals CMI and CMIB, and the clock CKB. Then, the CS driver 40' outputs the CS signal CSOUTn via the memory circuit 41, the transfer switch circuit 42, and the analogue switch circuit 43.

The following specifically describes the operation of the CS driver 40' until the CS driver 40' outputs a CS signal CSOUTn, with reference to FIGS. 1, 4, and 5. Note that the following describes operation mainly in a case where a positive polarity CS signal is outputted, that is, a case where a positive polarity signal CMI is supplied to the CS driver 40'.

First, the gate driver Gn on the n-th row (i) receives a signal SROn−1 supplied from a shift register of a gate driver Gn−1 on the (n−1)th row, and then (ii) supplies a gate signal GLn to the gate line 12 so as to turn on a TFT on the n-th row. At the same time, the gate signal GLn is supplied to the CS driver CSn on the n-th row. A signal SROn is supplied from a shift register of the gate driver Gn to a gate driver Gn+1 on a next row (the (n+1)th row).

The memory circuit 41 of the CS driver CSn which has received the gate signal GLn from the gate driver Gn takes in a polarity signal CMI in accordance with the gate signal GLn. More specifically, when a potential level of the gate signal GLn is changed from a low level (level L: first potential level) to a high level (level H: second potential level), that is, when the transistor 41a is turned on, the polarity signal CMI is transferred to the memory circuit 41, and then the polarity signal CMI is outputted as a signal LAn (a first signal) from the memory circuit 41. At the time, electric charge is accumulated (stored) in the capacitor 41c. That is, as shown in FIG. 5, while the gate signal GLn is being at the level H (that is, the transistor 41a is being activated), the polarity signal CMI is outputted, and accordingly the signal LAn has a level H. After that, when a potential level of the gate signal GLOn is changed from the level H to the level L, that is, when the activated transistor 41a is turned off, the transistor 41a is shut off, whereby the polarity signal CMI stops being outputted. Then, the capacitor 41c in which electric charge is stored allows the signal LAn to maintain a potential level (in this case, the level H) at the time when the transistor 41a is turned off. The signal LAn maintains the state (the level H) until the potential level of the gate signal GLn is changed from the level H to the level L next time, that is, during a single vertical scan period (1V).

When the potential level of the gate signal GLn is changed from the level L to the level H after a lapse of the period 1V, the polarity signal CMI is transferred and then outputted, whereby the signal LAn is switched from the level H to the level L. Then, the signal LAn maintains the state (the low level) during another single vertical scan period (1V). Thereafter, the above described process is repeated.

The signal LAn outputted from the memory circuit 41 via the process is supplied to the transistor 42a of the transfer switch circuit 42, and then outputted as a signal LAOn (a second signal) after a lapse of a single horizontal scan period (1H). More specifically, the transistor 42a receives a clock CKB by which the transistor 42a is turned on and off. At timing of a rising edge of the clock CKB, the transistor 42a is turned on, and then the signal LAn is outputted as the signal LAOn. As described above, the signal LAn outputted from the memory circuit 41 is generated in accordance with the gate signal GLn. Accordingly, the signal LAn is outputted in sync with timing of a clock CK. Moreover, a period from a rising edge of the clock CK to a rising edge of the clock CKB is defined as 1H. Accordingly, the signal LAn which has been outputted at timing of the rising edge of the clock CK is to be outputted as the signal LAOn at timing of the rising edge of the clock CKB, that is, after a lapse of 1H.

The signal LAOn which has been outputted from the transfer switch circuit 42 via the process is supplied to the transistor 43a of the analogue switch circuit 43. The analogue switch circuit 43 receives a positive polarity common voltage VCSH and a negative polarity common voltage VCSL. The transistor 43a is turned on and off in accordance with the signal LAOn. Accordingly, the transistor 43a (i) is turned on at timing of a rising edge (a level H) of the signal LAOn, and (ii) outputs, while being at the level H, the common voltage VCSH as a CS signal CSOUTn.

At timing when the transistors 41a and 41b are turned on, the polarity signals CMI and CMIB have polarities opposite to each other. Accordingly, the signals LAn and LABn supplied from the memory circuit 41 have respective different potential levels (levels H and L). Similarly, the signals LAOn and the LABOn supplied from the transfer switch circuit 42 have respective different potential levels (levels H and L). Therefore, as shown in FIG. 5, when one of the signals is at the level H, the other signal is at the level L. This makes it possible to output a CS signal whose electric potential is inverted in each frame.

As described above, the CS driver 40 of the present invention carries out CC driving by outputting the CS signal CSOUTn in accordance with the gate signal GLn on the row (the n-th row). According to the configuration, unlike the conventional technique, (i) a switch (UDSW in FIG. 26) for selecting an adjacent row and (ii) a wire for the switch are not required. This makes it possible to simplify a circuit structure of the CS driver 40.

Figure 6:
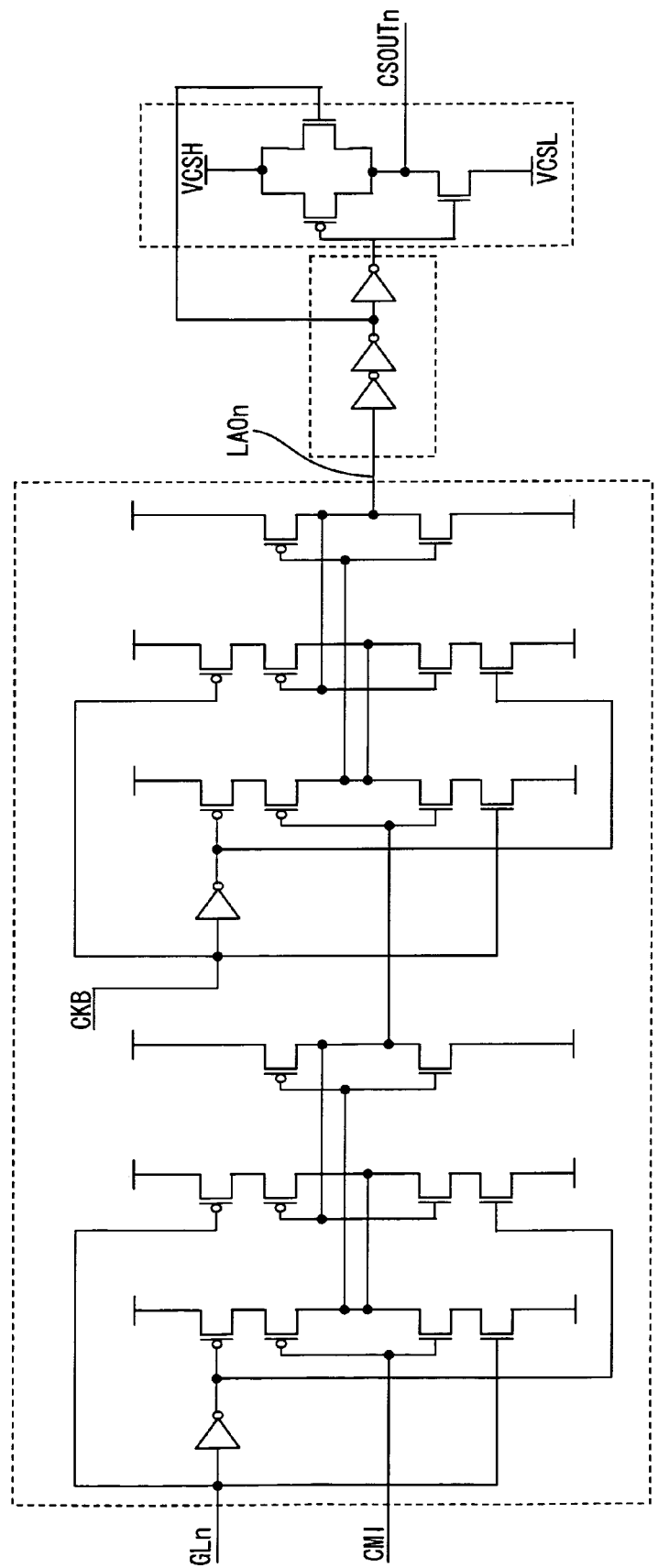
FIG. 6 is a circuit diagram illustrating a structure of a conventional CS driver made up of a CMOS.

As shown in FIG. 6, the CS driver 40 of the present invention can be applied to a circuit structure of a CMOS. The circuit structure of a CMOS also does not require the conventional switch UDSW, whereby a similar effect can be achieved. However, in view of manufacturing cost and the like, a single channel circuit structure is preferable. According to the single channel circuit structure, as compared to the circuit structure of a CMOS, manufacturing steps such as a masking step can be omitted, whereby production efficiency can be improved. Accordingly, advantageous effects such as reduction of manufacturing cost can be obtained.

Figure 7:
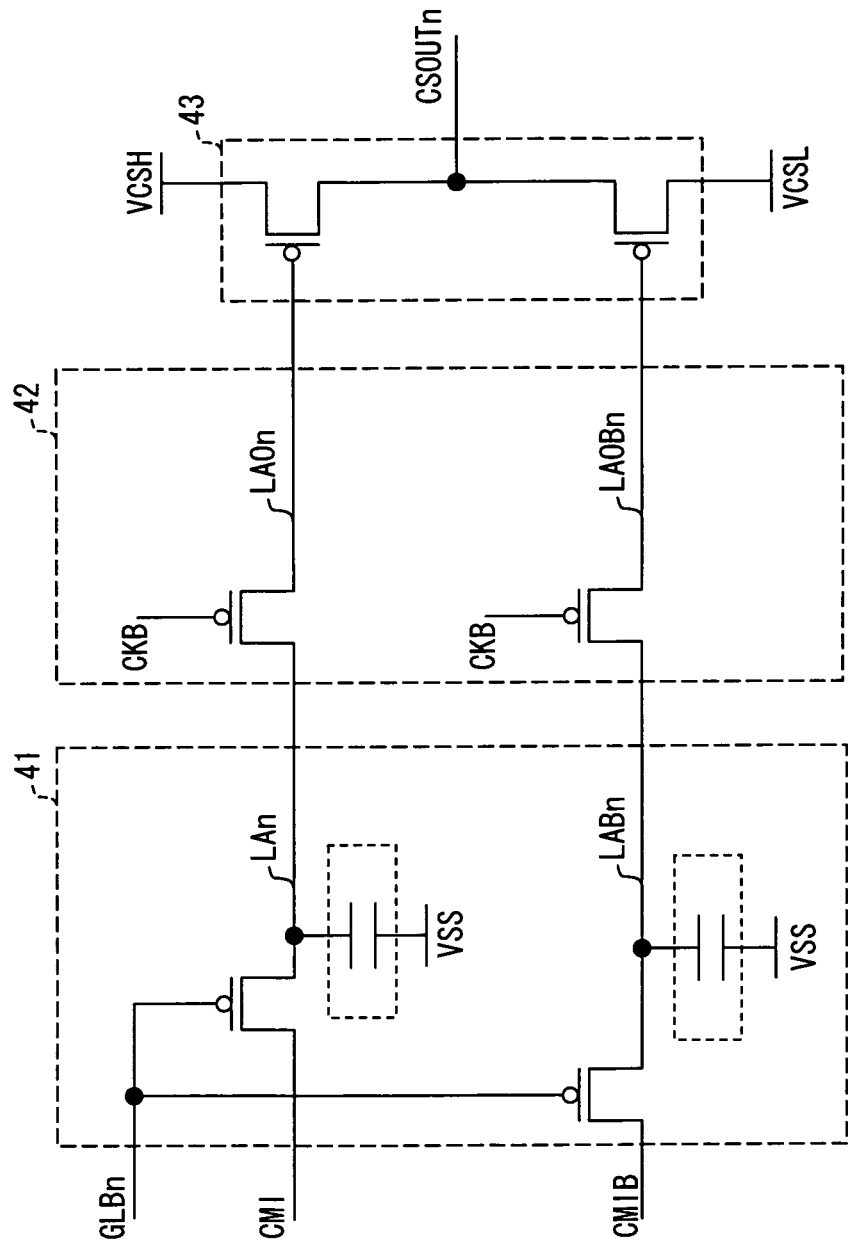
FIG. 7 is a circuit diagram illustrating a structure of a CS driver which is obtained by making the CS driver shown in FIG. 4 into a P-channel type.
Figure 8:
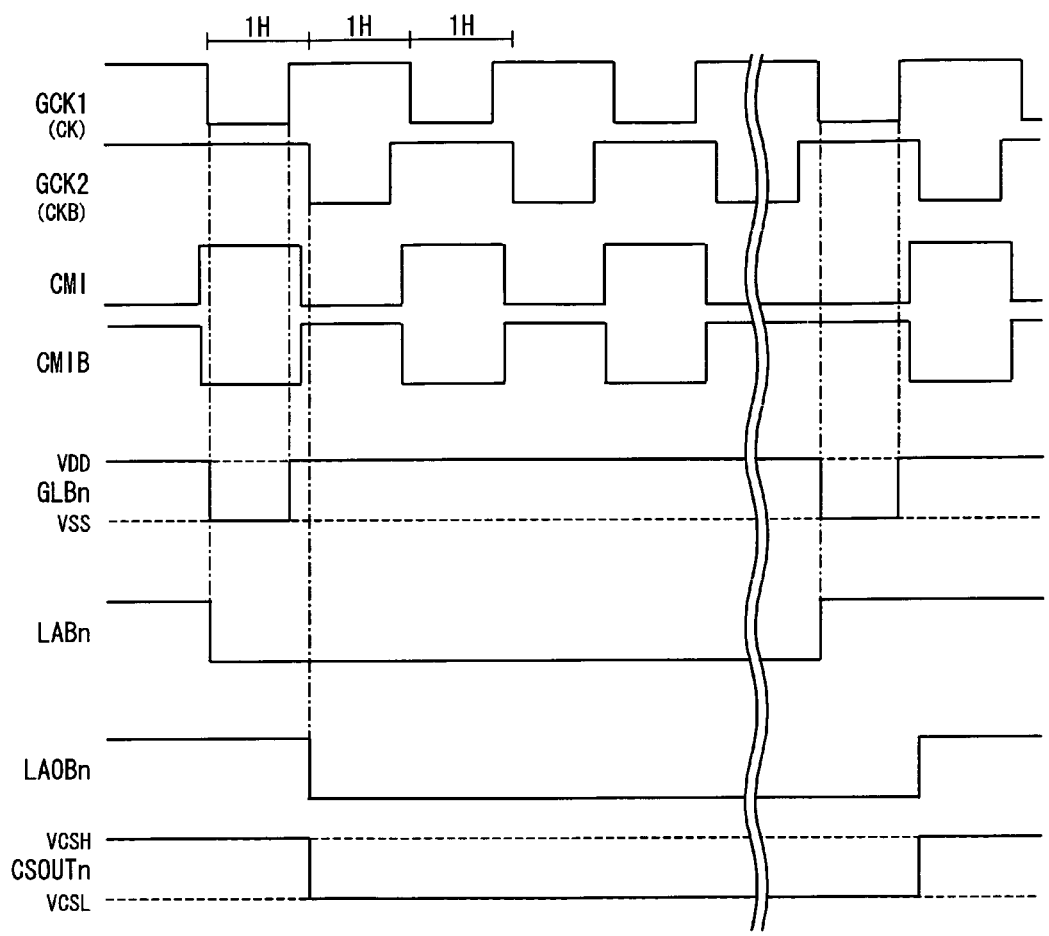
FIG. 8 is a timing chart illustrating waveforms of various signals in the CS driver shown in FIG. 7.

As described above, the CS driver 40' can be a P-channel driving circuit. FIG. 7 illustrates an example in which the CS driver 40' shown in FIG. 4 is has a configuration of a P-channel type. FIG. 8 is a timing chart illustrating waveforms of various signals in the CS driver. A generally known technique can be used for substituting an N-channel type with a P-channel type. Accordingly, an explanation of a specific method for the substitution is omitted.

According to the present embodiment, the CS driver 40 receives a signal as the gate signal GLn supplied from the gate driver 30. However, the present invention is not limited to this. For example, in a case where the gate driver 30 and the CS driver 40 are integrated so as to constitute the gate/CS driver 50 as described above, a signal supplied to the CS driver 40 can be a signal inside the gate driver 30, more specifically, the signal can be the signal SROn supplied from the shift register. The configuration can also obtain an effect similar to that obtained in the case where a gate signal is supplied.

Figure 9:
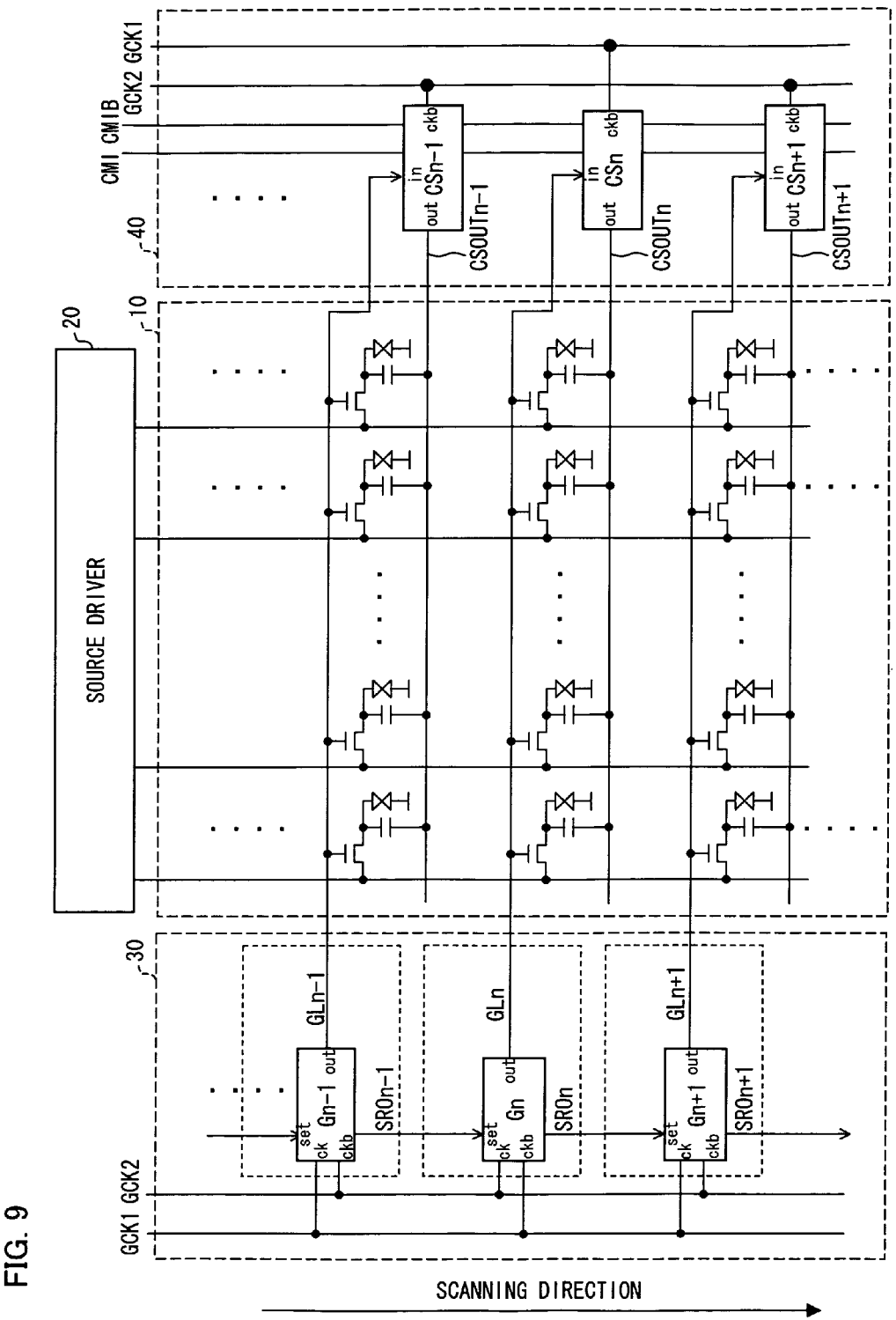
FIG. 9 is a block diagram illustrating a structure of a liquid crystal display device in which the gate driver and the CS driver in the liquid crystal display device shown in FIG. 1 are provided separately.
Figure 10:
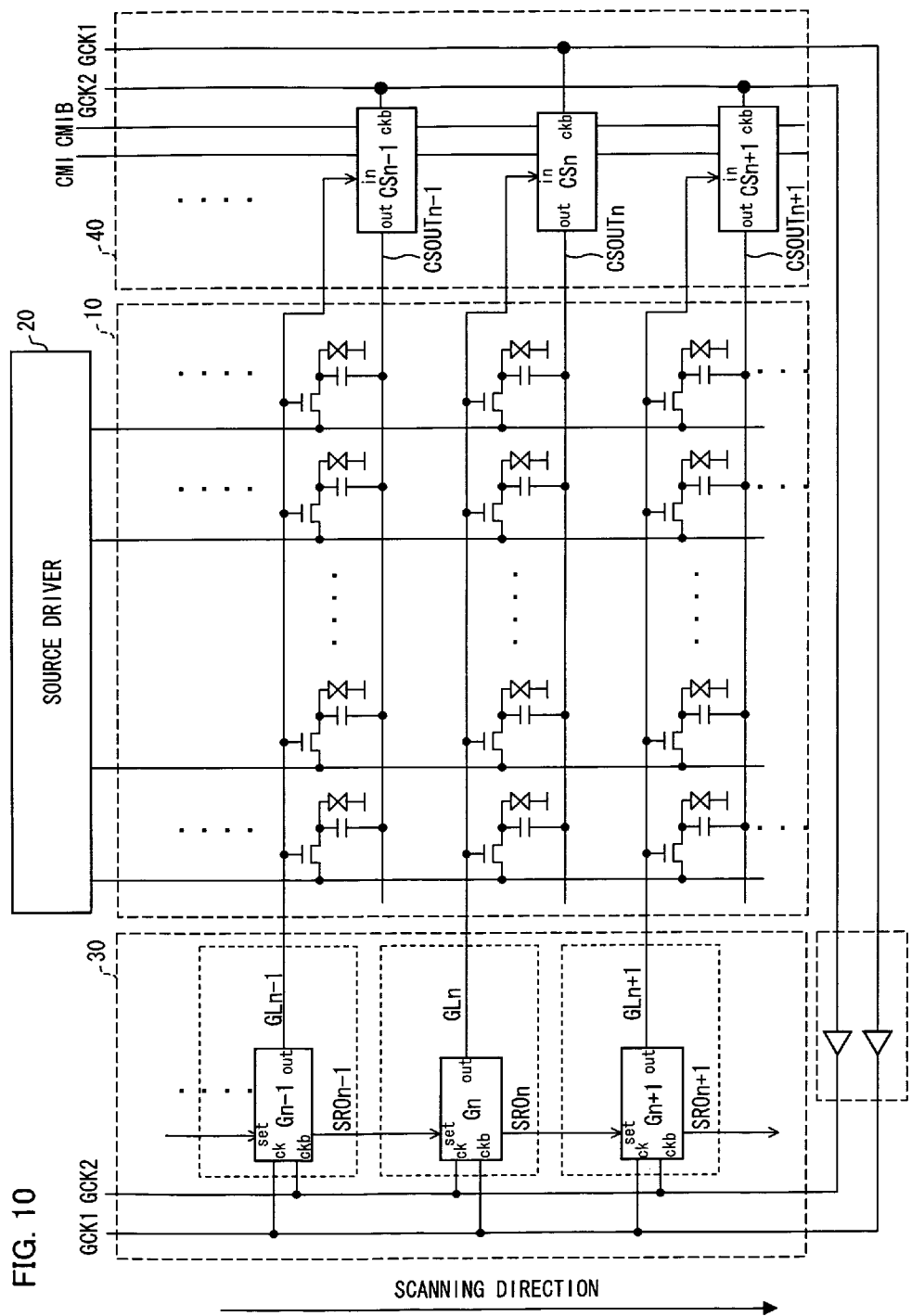
FIG. 10 is a block diagram illustrating a structure of a liquid crystal display device in which a buffer is provided between the gate driver and the CS driver in the liquid crystal display device shown in FIG. 9.

The gate driver 30 and the CS driver 40 are integrated so as to constitute the gate/CS driver 50. However, the present invention is not limited to this. As shown in FIG. 9, the gate driver 30 and the CS driver 40 can be provided separately. An overall size of the liquid crystal display device 1 can be reduced by providing the gate driver 30 and the CS driver 40 on respective sides of the display panel 10 (see FIG. 9). Note that, in the case where the drivers 30 and 40 are provided separately, gate clocks GCK1 and GCK2 need to be supplied to each of the drivers 30 and 40 from the control circuit. This causes wiring to be complicated. Accordingly, waveform distortion occurs due to wiring load, and the waveform distortion adversely affects operation timing of the drivers 30 and 40. In order to reduce the waveform distortion, it is preferable to provide a buffer between the drivers 30 and 40 (see FIG. 10). This makes it possible to compensate differences in process speed and transfer speed between the drivers 30 and 40, whereby the waveform distortion can be reduced.

The following describes a configuration in which operation of the CS driver 40 is further stabilized, whereby CC driving in the liquid crystal display device 1 is stabilized.

Example 2

Figure 11:
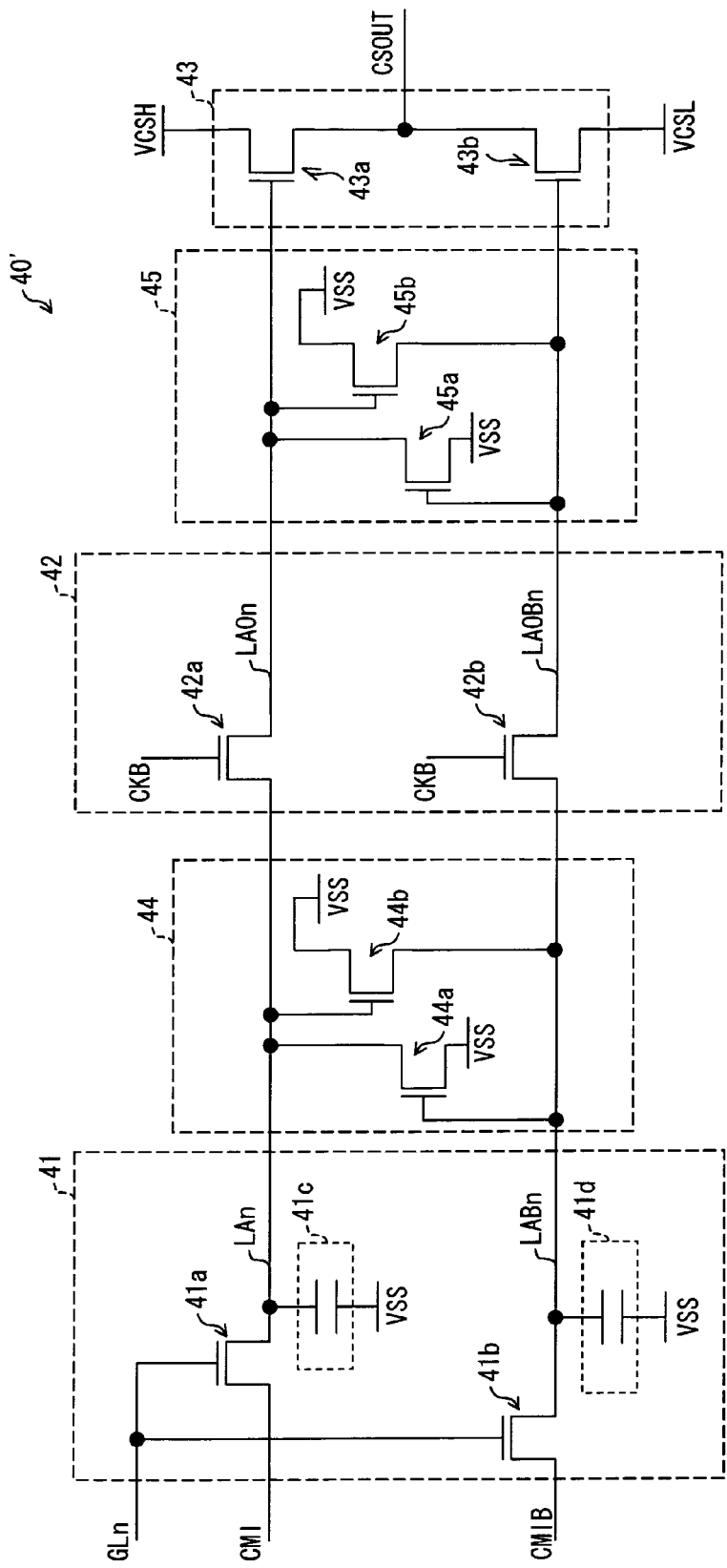
FIG. 11 is a circuit diagram illustrating a structure of a CS driver according to Example 2.

FIG. 11 is a circuit diagram illustrating a structure of a CS driver 40' in Example 2. The CS driver 40' in Example includes potential stabilizing circuits 44 and 45 in addition to the components of the CS driver 40' in Example 1.

According to the CS driver 40', signals LAn and LABn have respective different potential levels (levels H and L). Similarly, signals LAOn and LABOn have respective different potential levels (levels H and L) (see FIG. 5). For example, in a case where the signals LAn and LAOn are at the level H, the signals LABn and LABOn are at the level L. In order to output a stable CS signal, it is preferable that a relation between the potential levels is stabilized. However, each of the signals is floated for a certain period during which the signals are easily affected by noise. Accordingly, it would be possible that the potential level is varied. According to Embodiment 2, the potential stabilizing circuits 44 and 45 are provided for stabilizing the potential levels.

The potential stabilizing circuit 44 includes transistors 44a and 44b (thirteenth and fourteenth transistors). The transistor 44a is arranged so that a control electrode and a second electrode thereof are connected to a second electrode of the transistor 41b and a second electrode of the transistor 41a, respectively. Whereas, the transistor 44b is arranged so that a control electrode and a second electrode thereof are connected to the second electrode of the transistor 41a and the second electrode of the transistor 41b, respectively. The potential stabilizing circuit 45 includes transistors 45a and 45b which are connected to second electrodes of the transistors 42a and 42b in a similar way to the transistors 44a and 44b (see FIG. 11). According to the configuration, for example, in a case where a potential level of the signal LAn is at the level H (the second potential level), the transistor 44b is turned on, whereby a potential level of the signal LABn becomes a reference voltage (VSS) and is fixed at the level L (the first potential level). Similarly, in a case where a potential level of the signal LAOn is at the level H, the transistor 45b is turned on, whereby a potential level of the signal LAOBn becomes a reference voltage (VSS) and is fixed at the level L. As described above, when a potential level of one of the paired signals (LAn and LABn, or LAOn and LAOBn) is at the level H, a potential level of the other signal is fixed at the reference voltage VSS (level L). Accordingly, the electric potential at the level L can be stabilized. This makes it possible to fix at least one of the electric potentials (level L), whereby a stable CS signal can be outputted.

Example 3

Figure 12:
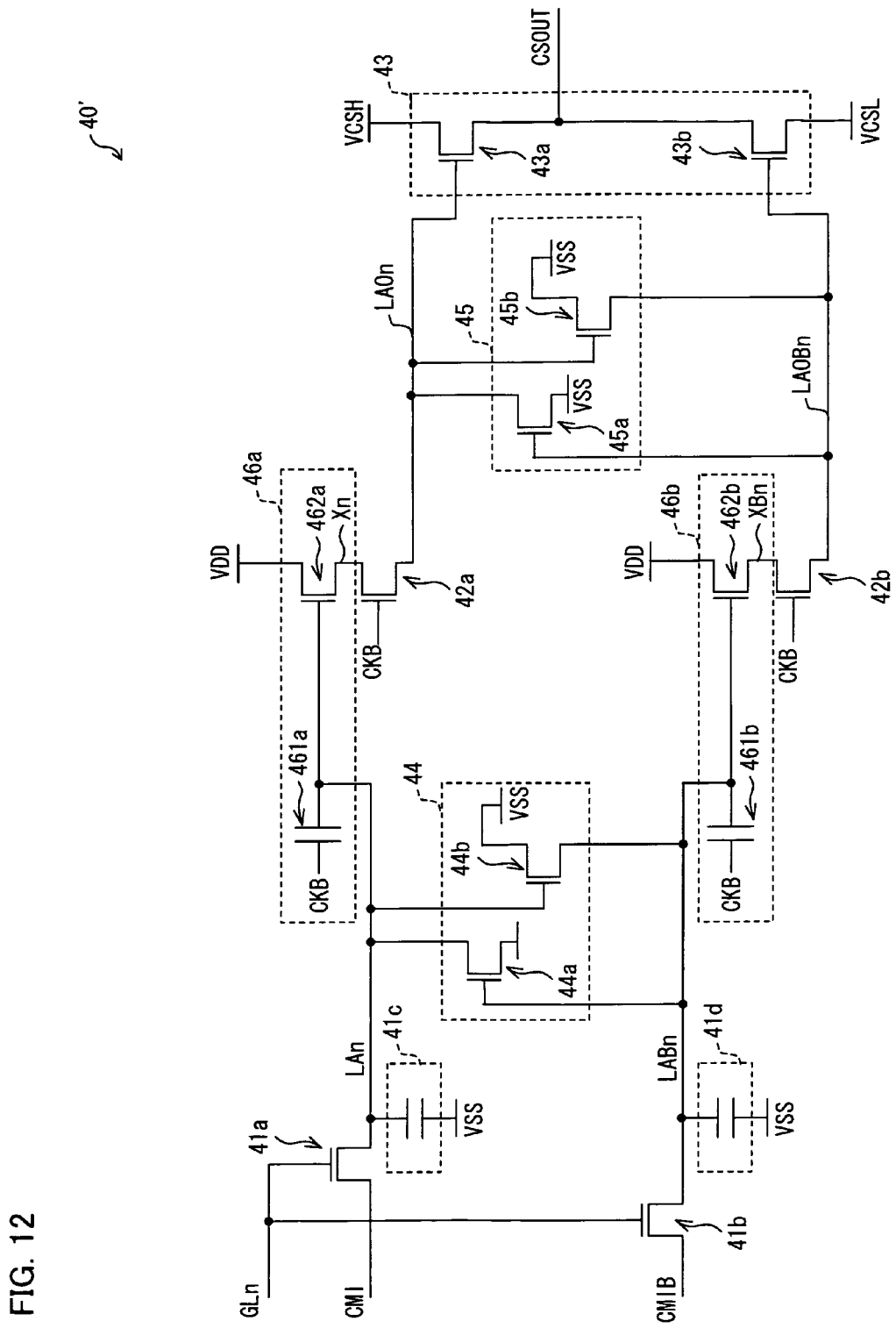
FIG. 12 is a circuit diagram illustrating a structure of a CS driver according to Example 3.
Figure 13:
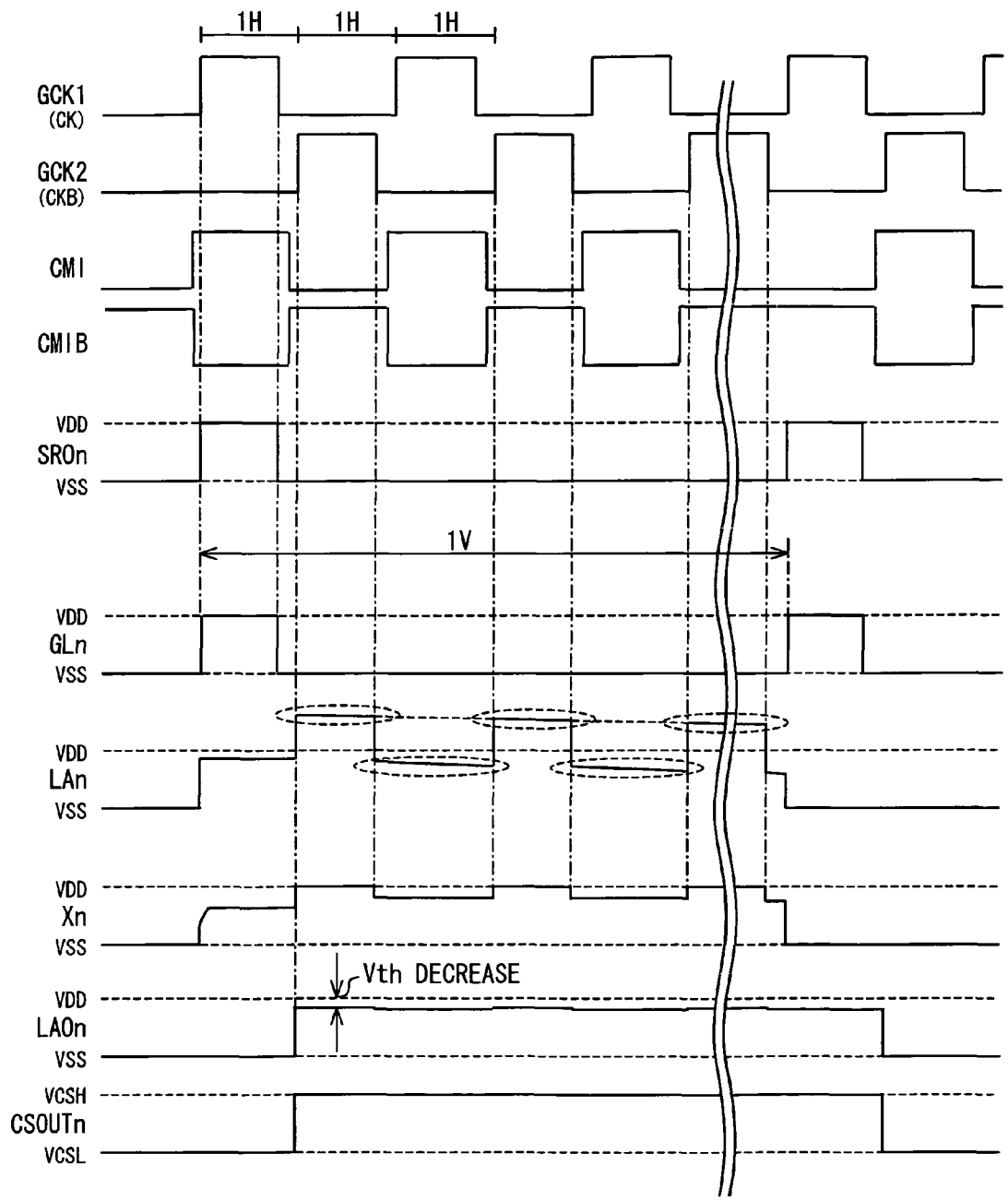
FIG. 13 is a timing chart illustrating waveforms of various signals in the CS driver according to Example 3.

FIG. 12 is a circuit diagram illustrating a structure of a CS driver 40' in Example 3. FIG. 13 is a timing chart illustrating waveforms of various signals in the CS driver 40'. The CS driver 40' in Example 3 includes booster circuits 46 (46a and 46b) in addition to the components of the CS driver 40' in Example 2.

Figure 14:
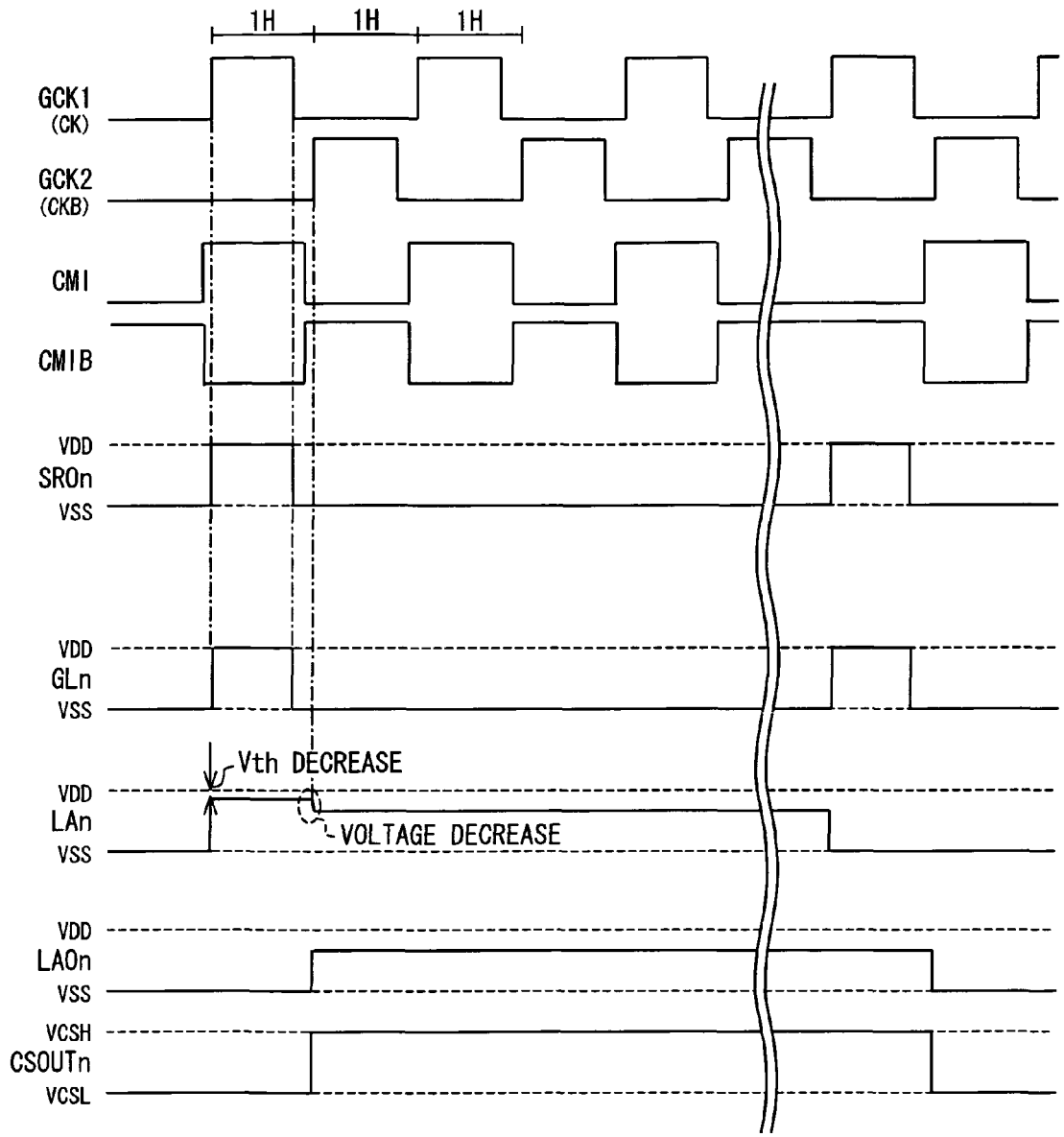
FIG. 14 is a timing chart illustrating waveforms of various signals for explaining a principle of the CS driver according to Example 3.

According to the CS drivers 40' in Examples 1 and 2, as the signals LAn in FIGS. 4 and 14 indicate in detail, when the transistor 41a is turned on and the polarity signal CMI at the level H is taken in, the electric potential of the signals LAn is decreased by a threshold amount of voltage (Vth) (hereinafter, this phenomenon is referred to as "threshold decrease") due to a writing characteristic of the transistor. Then, a voltage of the decreased beyond threshold signal LAn is further decreased due to distribution property of electric charge between capacitance of the capacitor 41c (see FIG. 4) and load capacitance of the transistor 43a in the analogue switch circuit 43 (see FIG. 4) when the transistor 42a in the transfer switch circuit 42 is turned on at timing of a rising edge of the signal CKB. The signal LAOn in FIG. 14 illustrates a state where the voltage-decreased signal LAn is transferred after a lapse of 1H, and then the signal LAOn is affected by the voltage decrease of the signal LAn.

Due to such voltage decrease, a stable electric potential cannot be supplied to the analogue switch circuit 43, and accordingly stabilization of CS signal output is prevented. As a method for solving such a problem, for example, capacity of the capacitors 41c and 41d in the memory circuit 41 may be increased in advance. However, the method is not optimum because the method can lead to increase in size of a circuit and/or in costs.

As a more preferable method, the CS driver 40' in Example 3 includes the booster circuits 46 (46a and 46b). The booster circuit 46a includes: a capacitor 461a (a third capacitor element) which increases an electric potential of the signal LAn outputted from the memory circuit 41; and a transistor 462a (a seventh transistor) which (i) is turned on and off in accordance with the signal LAn whose potential level has been increased and (ii) receives a predetermined voltage (VDD) as input data. Similarly, the booster circuit 46b includes a capacitor 461b (a fourth capacitor element) and a transistor 462b (an eighth transistor).

Figure 15:
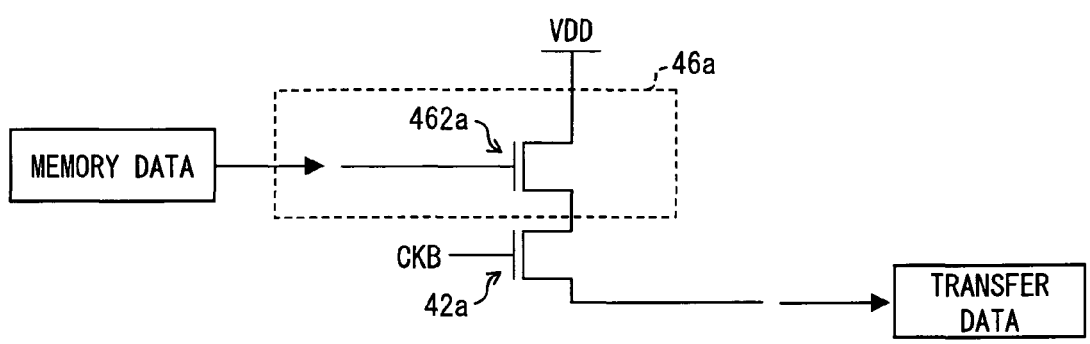
FIG. 15 is a circuit diagram schematically illustrating a relation between a booster circuit and a transfer switch circuit of the CS driver according to Example 3.

As shown in FIG. 12, each of the booster circuits 46 is provided in a previous stage with respect to the transfer switch circuit 42, so that a data line (an output line of the memory circuit 41) and an output line of the transfer switch circuit 42 are not directly connected with each other but are connected via a gate. FIG. 15 is a circuit diagram schematically illustrating a relation between the booster circuit 46 and the transfer switch circuit 42. As shown in FIG. 15, memory data, which is based on the signal LAn outputted from the memory circuit 41, is inputted as a signal only for turning on and off the transistor 462a but the memory data is not outputted as transfer data. This makes it possible to prevent the voltage decrease caused due to the distribution property of electric charge.

The following describes operation of the CS driver 40' in Example 3 with reference to FIG. 12 and a timing chart shown in FIG. 13. Note that, regarding components which operate in the same way as those in Examples 1 and 2, explanations thereof are omitted.

First, when the polarity signal CMI at the level H (the second potential level) is taken in, the electric potential of the signal LAn which is outputted when the transistor 41a is turned on is decreased by a threshold amount of voltage (Vth). This decrease in the electric potential of the signal LAn is caused due to a writing characteristic of the transistor 41a. The signal LAn is supplied to the booster circuit 46a, and then potential level of the signal LAn is increased at timing of the rising edge of the clock CKB (in the present embodiment, the third potential level is lager than the second potential level because the transistor is made up of an N-channel MOS transistor). As such, the potential level of the signal LAn is increased in every 1H in sync with a cycle of the clock CKB. In accordance with amplitude of the clock CKB, the potential level of signal LAn is increased from the second potential level to the third potential level.

Then, the signal LAn is supplied, as a gate signal, to the transistor 462a so that the transistor 462a is turned on and off. A signal Xn is an output signal outputted from the booster circuit 46a. At a first rising edge of the signal LAn, that is, when a decreased beyond threshold voltage is applied to the transistor 462a, the signal Xn whose electric potential is further decreased beyond threshold from the predetermined voltage (VDD; the second potential level) is outputted. Then, when the signal LAn whose potential level has been increased at the timing of the rising edge of the clock CKB is supplied to the transistor 462a, the signal Xn at the electric potential of VDD is outputted. With the configuration, the signal Xn outputted form the booster circuit 46a can be maintained at the potential level of VDD in every 1H.

Then, the signal Xn is supplied to the transfer switch circuit 42. Further, after a lapse of 1H, the signal Xn is supplied to the analogue switch circuit 43 from the transfer switch circuit 42, as a signal LAOn whose electric potential has been decreased beyond threshold from the voltage VDD in every 1H.

As described above, a voltage of the signal LAOn in Example 3 is not so much decreased from the voltage VDD as that of the signal LAOn (see FIG. 14) in Examples 1 and 2 is. This makes it possible to output a stable CS signal.

Example 4

Figure 16:
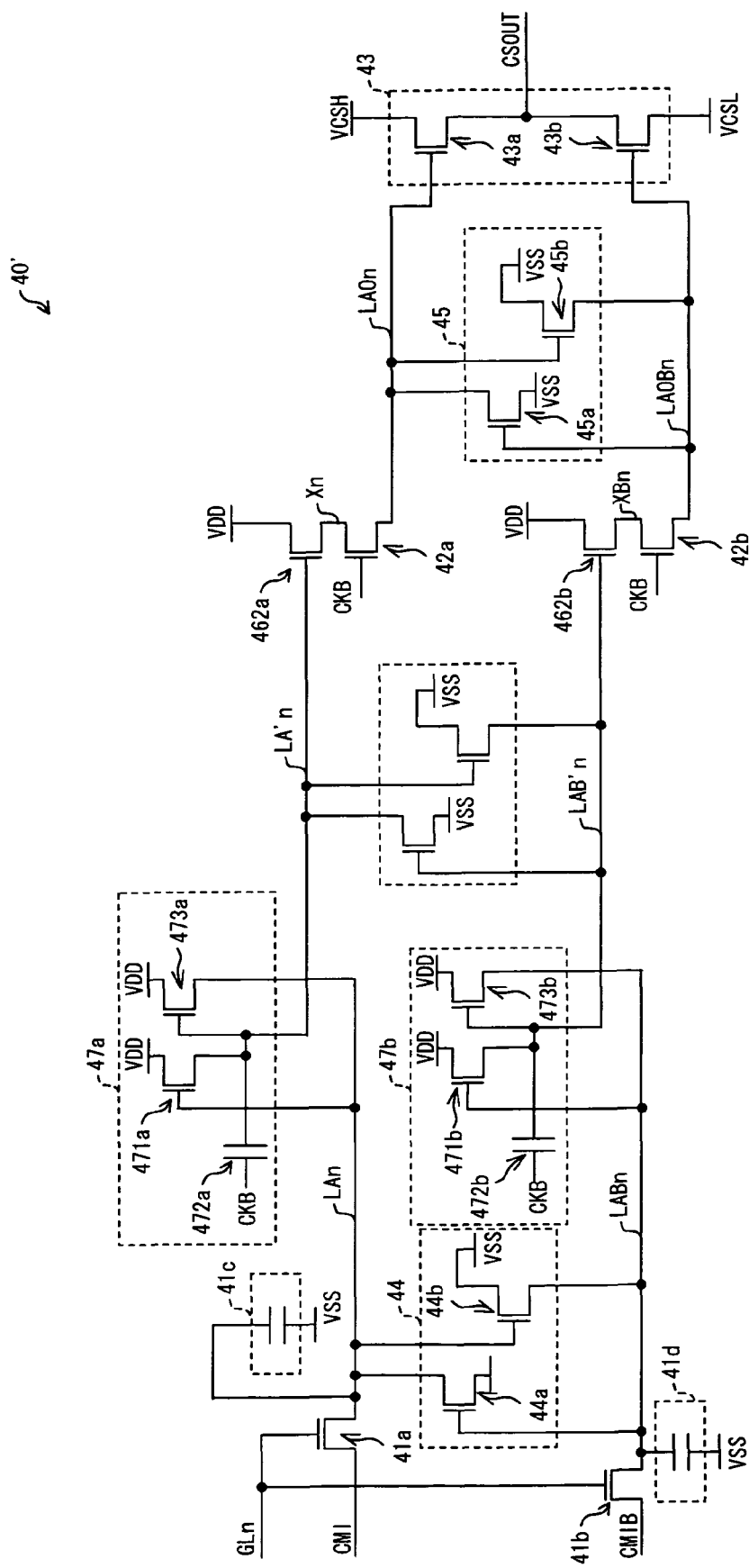
FIG. 16 is a circuit diagram illustrating a structure of a CS driver according to Example 4.
Figure 17:
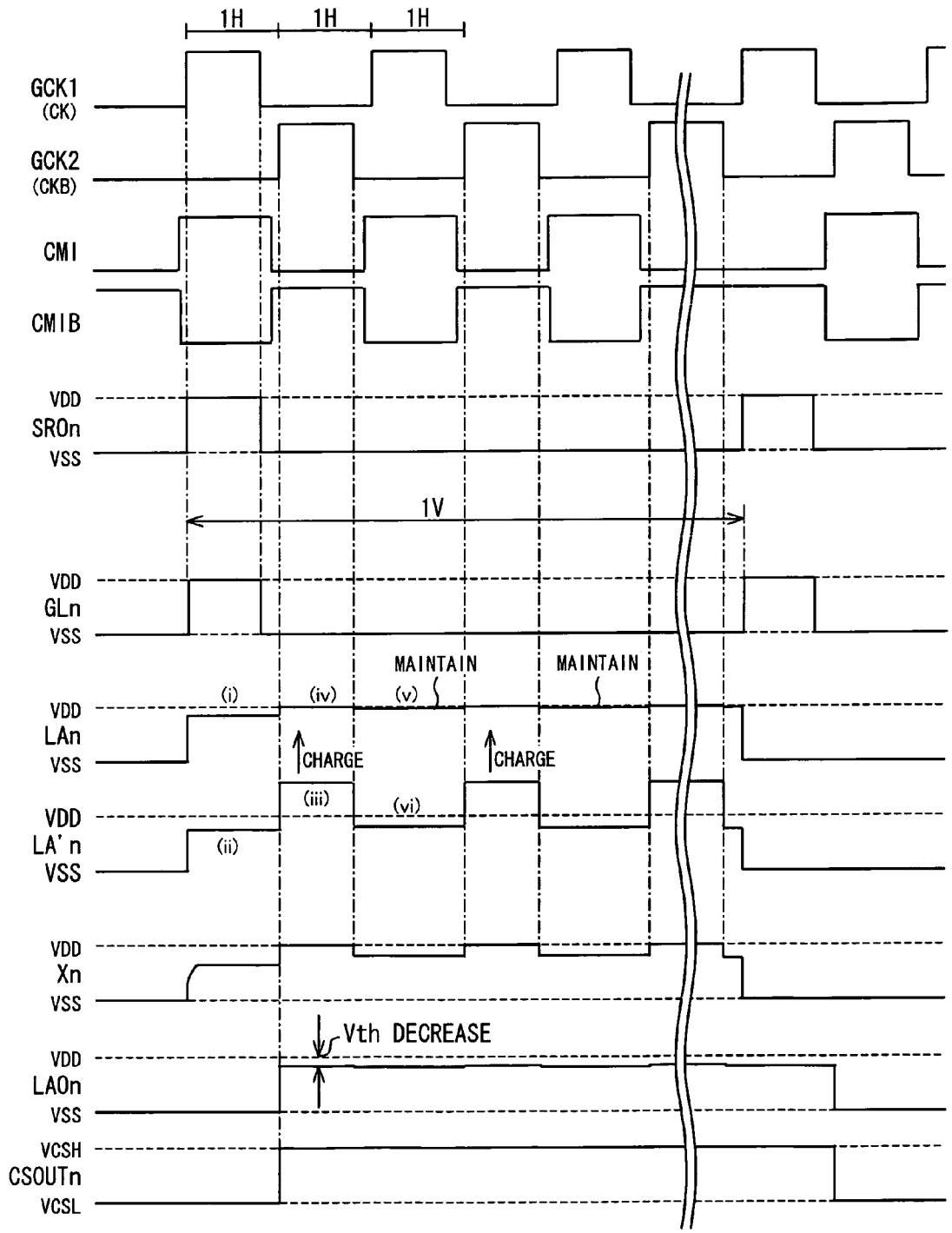
FIG. 17 is a timing chart illustrating waveforms of various signals in the CS driver according to Example 4.

FIG. 16 is a circuit diagram illustrating a structure of a CS driver 40' in Example 4. FIG. 17 is a timing chart illustrating waveforms of various signals in the CS driver 40'. The CS driver 40' in Example 4 includes refresh circuits 47 (47a and 47b) in addition to the components of the CS driver 40' in Example 3.

According to each of the CS drivers 40' in Examples 1 through 3, a potential level of the signal LAn in the memory circuit 41 is maintained during the period 1V. On a transmission path of a signal, there is a tendency that a leakage current is inevitably occurred, whereby the potential level is decreased as time passes. The potential level of the signal LAn is gradually decreased due to an effect of the leakage current. Accordingly, a potential level at the beginning of the period 1V differs at the end of the period 1V. This prevents stable voltage supply, and as a result, the CS signal cannot be outputted stably. This phenomenon can be occurred in any of Examples 1 through 3. As an example of the phenomenon, the voltage decrease of the signal LAn caused due to the leakage current is illustrated in FIG. 13 (indicated by dotted circles on the signal LAn in FIG. 13). As indicated by the signal LAn, it is seen that the potential level is decreased as time passes.

In view of the phenomenon, the CS driver 40' in Example 4 includes refresh circuits 47 (47a and 47b) for restraining the voltage decrease caused due to the leakage current. The refresh circuit 47a is turned on and off by the signal LAn outputted from the memory circuit 41. The refresh circuit 47a includes: a transistor 471a (a ninth transistor) which receives a predetermined voltage (VDD) as input data; a capacitor 472a (a fifth capacitor element) which increases a potential level of a signal outputted from the transistor 471a; and a transistor 473a (a tenth transistor) which (i) is turned on and off by the signal whose potential level has been increased and (ii) receives the predetermined voltage (VDD) as input data. Similarly, the refresh circuit 47b includes: a transistor 471b (an eleventh transistor); a capacitor 472b (a sixth capacitor element); and a transistor 473b (a twelfth transistor).

As shown in FIG. 16, each of the refresh circuits 47 is provided in a previous stage with respect to the transfer switch circuit 42.

The following describes operation of the CS driver 40' in Example 4 with reference to FIG. 16 and a timing chart shown in FIG. 17. Note that, regarding components which operate in the same way as those in Examples 1 through 3, explanations thereof are omitted.

First, when the polarity signal CMI at the level H is taken in, an electric potential of the signal LAn which is outputted when the transistor 41a is turned on is decreased by a threshold amount of voltage (Vth) due to a writing characteristic of the transistor 41a (see a waveform (i) of the signal LAn in FIG. 17). The signal thus decreased beyond threshold is supplied to the refresh circuit 47a, and then the potential level of the signal is decreased beyond threshold again due to the transistor 471a (see a waveform (ii) of the signal LA'n in FIG. 17). After that, the potential level of the signal thus decreased beyond threshold again is increased at timing of the rising edge of the clock CKB (see a waveform (iii) of the signal LA'n in FIG. 17). The signal whose potential level has been increased is outputted from the refresh circuit 47a as a signal LA'n. At the same time, the signal whose potential level has been increased turns on the transistor 473a, and accordingly, the capacitor 41c is charged with the predetermined voltage (VDD) (see a waveform (iv) of the signal LAn in FIG. 17). Note that the clock CKB has a potential level (the third potential level) which is larger than a potential level (the second potential level) of the voltage VDD.

The operation of charging the capacitor 41c is synchronized with operation timing of the clock CKB. Accordingly, the charging operation is carried out (i) in every 1H and (ii)

during the clock CKB is being at the level H. As a result, the potential level of the signal LAn is increased to the voltage VDD in every 1H.

Then, the signal LAn which has been outputted at the potential level of the voltage VDD maintains the potential level during a period between a falling edge and a next rising edge of the clock CKB (see a waveform (v) of the signal LAn in FIG. 17). The potential level of the signal LA'n which is outputted in the period is decreased beyond threshold due to the transistor 471a (see a waveform (vi) of the signal LA'n in FIG. 17). Then, at the next rising edge of the clock CKB, the potential level of the signal LA'n is increased again, whereby the capacitor 41c is charged with the predetermined voltage (VDD). Thereafter, the process is repeated.

Then, the signal LA'n is supplied for turning on and off the transistor 462a in the booster circuit 46a of Example 3 (see FIG. 12).

According to the configuration of Example 4, the capacitor 41c is charged with electric charge in every 1H so that the potential level of the signal LAn is increased to a potential level larger than that of the voltage VDD. Accordingly, a period during which the potential level is maintained can be reduced from the period 1V. This makes it possible to restrain voltage decrease caused due to a leakage current. Therefore, a stable potential level can be maintained during the period 1V (one frame), whereby a CS signal can be outputted more stably.

According to the present embodiment, the clock signal is supplied as a two-phase signal, whereby the refresh circuit 47a increases the potential level in every 1H. However, in a case where the clock signal is inputted with, for example, three-phase, four-phase, or further, the potential level is increased less frequently than every 1H.

Figure 18:
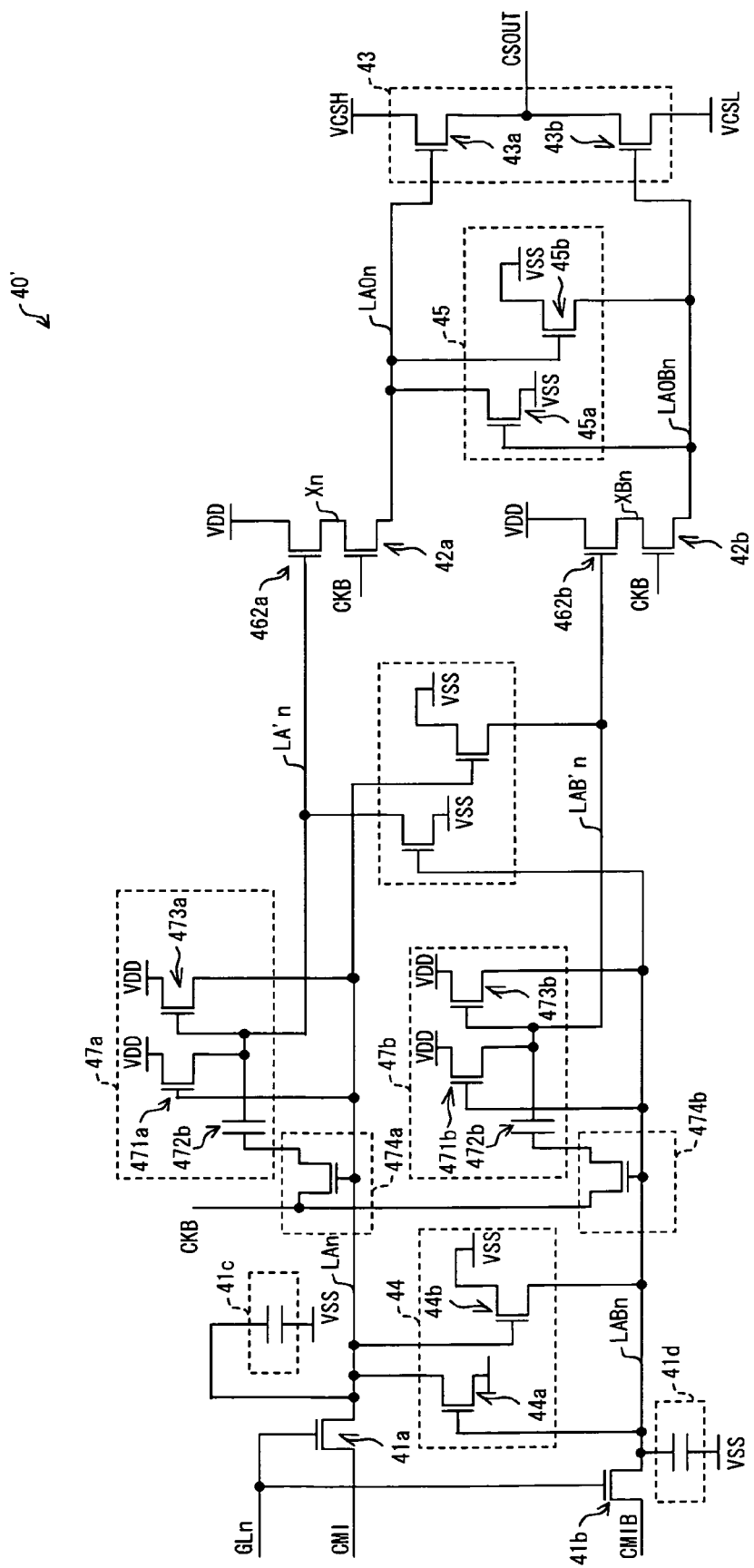
FIG. 18 is a circuit diagram illustrating a structure in a case where a transistor is provided between a clock CKB line and a refresh circuit of the CS driver according to Example 4.

Each of the refresh circuits 47 of the Example 4 is subjected to load capacitance (e.g., 200 fF). Therefore, in a case where the refresh circuits 47 are provided on each of the rows, a clock CKB receives large load. In view of this feature, as shown in FIG. 18, it is preferable that transistors 474a and 474b as a capacity reduction switch circuit 474 are provided between the clock CKB line and each of the refresh circuits 47. This prevents the clock CKB line and each of the capacitors 472b from being directly connected with each other. Accordingly, when a signal supplied to the transistor 474a is at a level L, the transistor 474a is turned off, whereby the clock CKB line can be separated off from each of the capacitors 472b. This makes it possible to reduce the clock load.

Example 5

Figure 19:
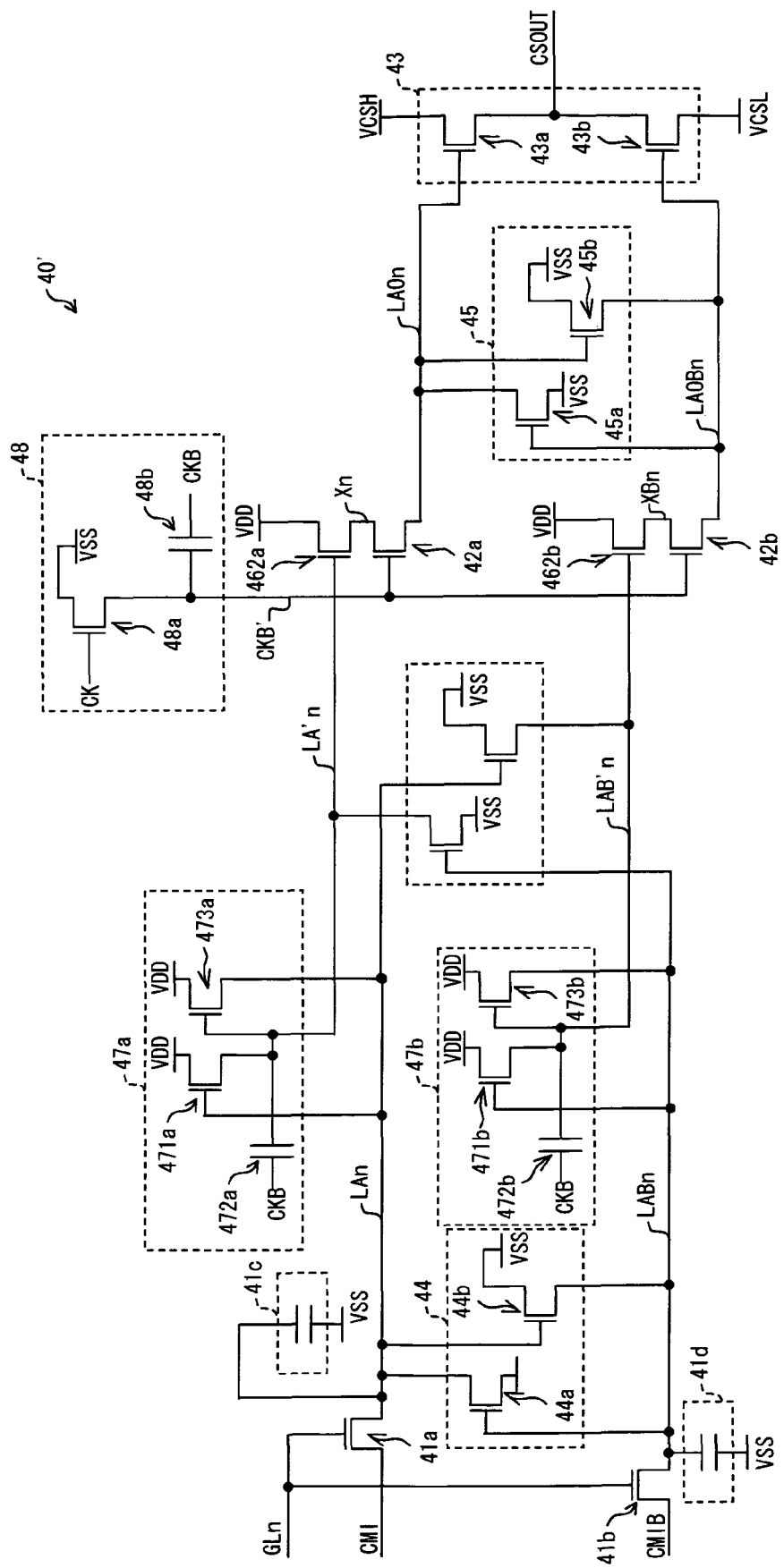
FIG. 19 is a circuit diagram illustrating a structure of a CS driver according to Example 5.
Figure 20:
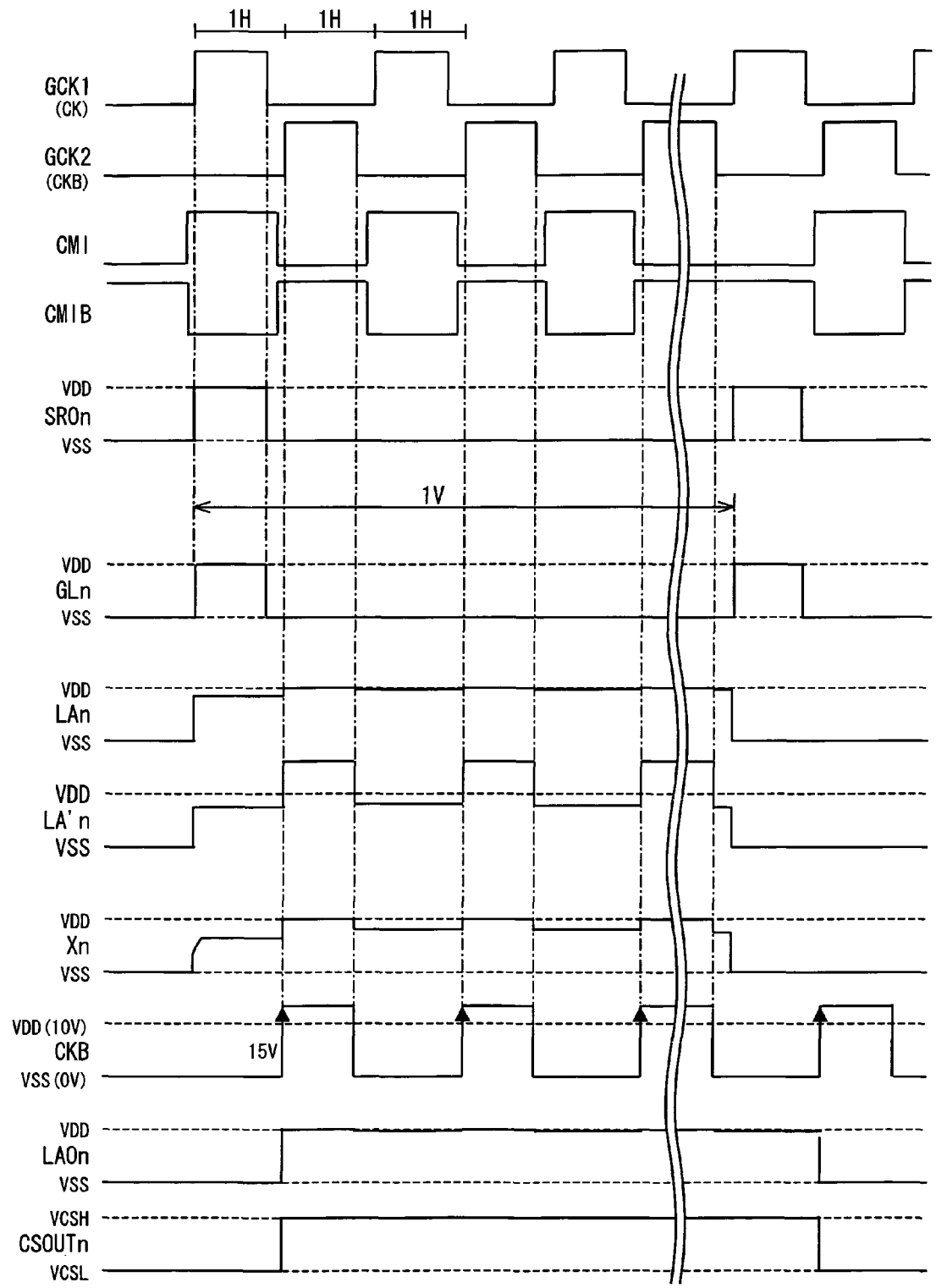
FIG. 20 is a timing chart illustrating waveforms of various signals in the CS driver according to Example 5.

FIG. 19 is a circuit diagram illustrating a structure of a CS driver 40' in Example 5. FIG. 20 is a timing chart illustrating waveforms of various signals in the CS driver 40'. The CS driver 40' in Example 5 includes a transfer clock booster circuit 48 (clock booster circuit) in addition to the components of the CS driver 40' in Example 4.

According to the CS drivers 40' of Examples 1 through 4, threshold decrease is occurred due to a writing characteristic of the transistor 42a in the transfer switch circuit 42. More specifically, for example, as indicated by the waveform of the signal LAOn in FIG. 17, when the transistor 42a (see FIG. 16) is turned on and the voltage VDD of the signal Xn is taken in, an electric potential of the signal LAOn is decreased by a threshold amount of voltage (Vth) due to a writing characteristic of the transistor. This prevents a stable electric potential from being supplied to the analogue switch circuit 43, whereby stabilization in outputting a CS signal cannot be achieved.

In view of the problem, the CS driver 40' of Example 5 includes a transfer clock booster circuit 48 for preventing the threshold decrease in the transfer switch circuit 42. The transfer clock booster circuit 48 is turned on and off by a clock CK. The transfer clock booster circuit 48 includes: a transistor 48a (a fifteenth transistor) which receives a reference voltage (VSS) as input data; and a capacitor 48b (a seventh capacitor element) which increases, by a clock CKB, a potential level of a signal outputted from the transistor 48a.

As shown in FIG. 19, the transfer clock booster circuit 48 is provided in a previous stage with respect to the transfer switch circuit 42, so that the transistor 42a in the transfer switch circuit 42 is turned on and off by a signal outputted from the transfer clock booster circuit 48. The following describes a specific operation example of the transfer clock booster circuit 48. In Example 5, it is assumed that the clocks CK and CKB have amplitude of 15 V (−5 V through +10 V), the reference voltage (VSS) is 0 V, and the predetermined voltage (VDD) is 10 V.

First, at a rising edge of the clock CK (i.e., when the transistor 48a is turned on), the reference voltage (VSS) is written in the capacitor 48b, whereby a voltage of the capacitor 48b becomes 0 V. Then, at a falling edge of the clock CK (i.e., when the transistor 48a is turned off), the amplitude 15 V of the clock CKB (a signal CKB') is outputted at timing of a rising edge of the clock CKB. Then, the signal CKB' at 15 V is supplied to the transistor 42a. This allows the transistor 42a to be turned on with a voltage (CKB': 15 V) which is larger than that of the signal Xn (Xn in FIG. 17: VDD (10 V)) serving as the input data to the transistor 42a. Therefore, the voltage VDD (10 V) can be outputted as a signal LAOn from the transfer switch circuit 42, without being decreased beyond threshold.

The signal outputted from the transfer clock booster circuit 48 is indicated as the signal CKB' in the timing chart shown in FIG. 20. As shown in FIG. 20, a potential level of the signal CKB' is increased to a voltage (15 V: the third potential level) which is larger than the voltage VDD (10 V: the second potential level) at timing of the rising edge of the clock CKB. This allows the signal LAOn outputted from the transfer switch circuit 42 to maintain the electric potential of the voltage VDD (10 V) without being decreased beyond threshold. This operation is carried out in sync with the timing of the clock CKB, whereby the electric potential is increased in every 1H. This makes it possible to stabilize the electric potential of the signal LAOn. Accordingly, a signal with a stable electric potential can be supplied to the analogue switch circuit 43, whereby the CS signal can be outputted stably.

Figure 21:
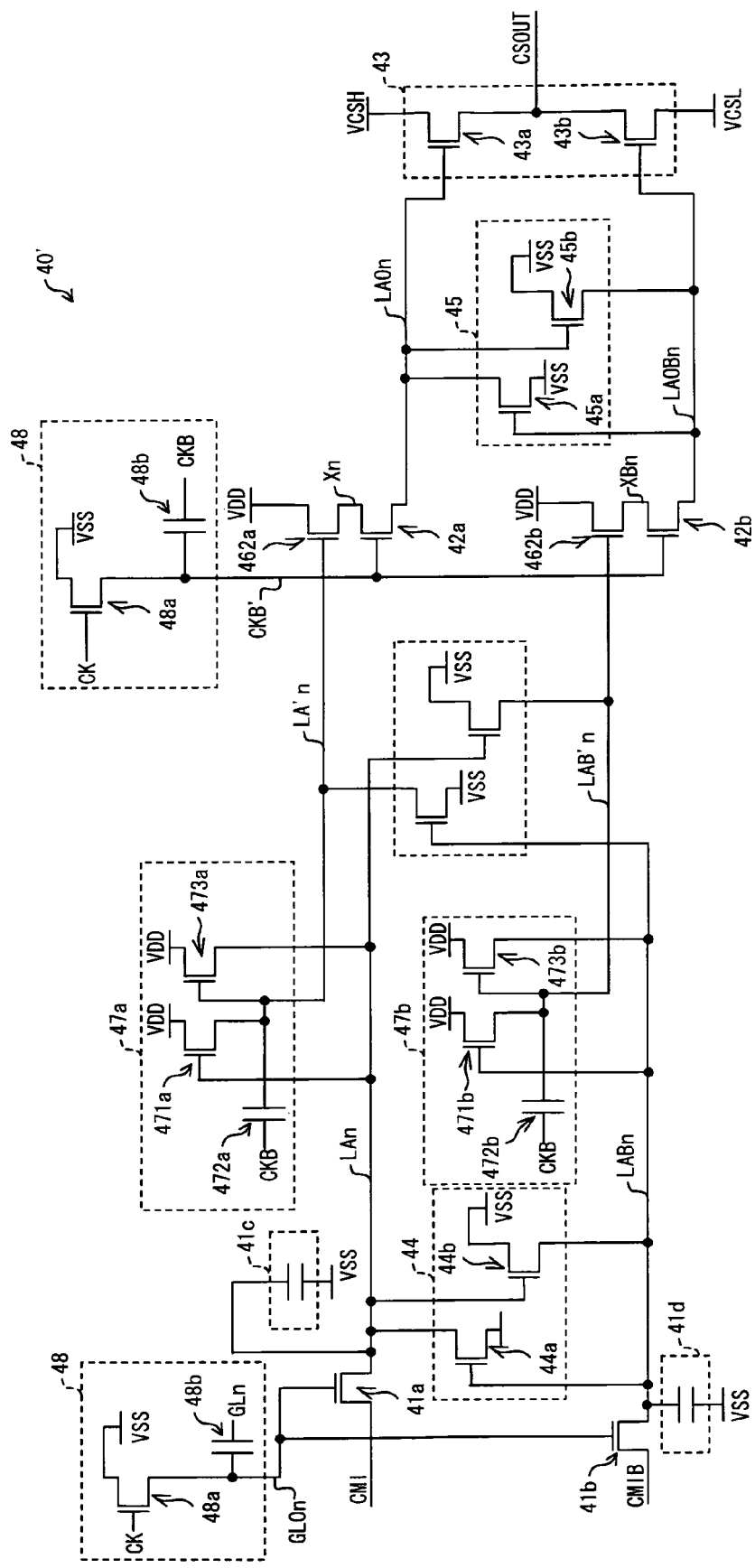
FIG. 21 is a circuit diagram illustrating a structure of another CS driver according to Example 5.
Figure 22:
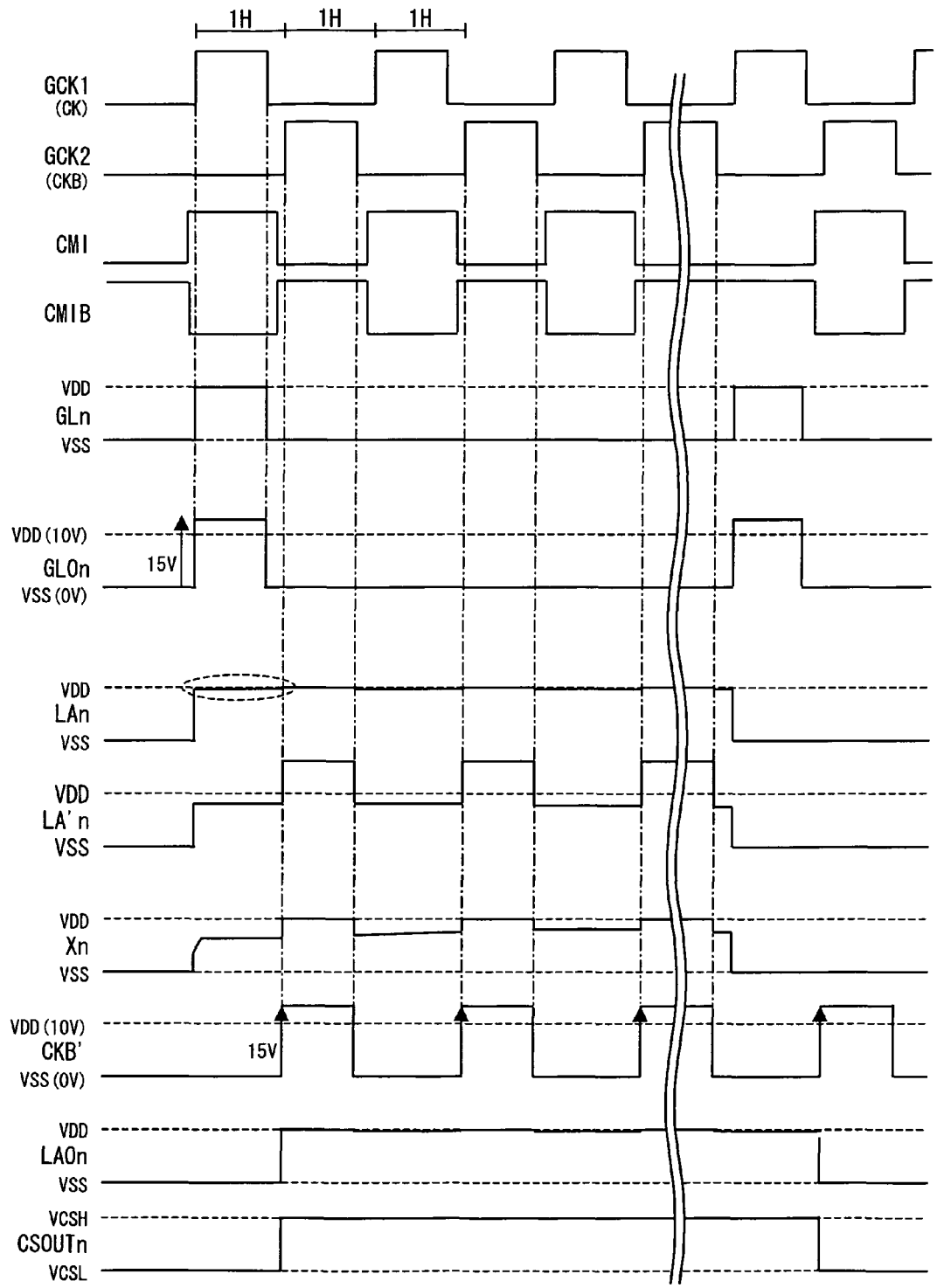
FIG. 22 is a timing chart illustrating waveforms of various signals in the CS driver shown in FIG. 21.

The transfer clock booster circuit 48 can be applied to the transistors 41a and 41b of the memory circuit 41. FIG. 21 is a circuit diagram illustrating a structure of another CS driver 40' in Example 5. FIG. 22 is a timing chart illustrating waveforms of various signals in the CS driver 40'.

The transfer clock booster circuit 48 in the another CS driver 40' is turned on and off by the clock CK. The transfer clock booster circuit 48 includes: a transistor 48a which receives a reference voltage (VSS) as input data; and a capacitor 48b which increases, by a gate signal GLn, a potential level of a signal outputted from the transistor 48a. Note that, in this configuration also, the clock CK and the gate signal GLn has amplitude of 15 V (−5 V through +10 V), the reference voltage (VSS) is 0 V, and the electric potential of the polarity signal CMI is 10 V.

The signal outputted from the transfer clock booster circuit 48 is indicated as a signal GLOn in the timing chart shown in FIG. 22. As shown in FIG. 22, a potential level of the signal GLOn is increased to a voltage (15 V) which is larger than the voltage VDD (10 V) at timing of the rising edge of the clock CK. This allows the transistor 41a to be turned on by a voltage (GLOn: 15 V) which is larger than that of the signal CMI (10 V) serving as input data to the transistor 41a. Accordingly, the signal CMI (10 V) is outputted as a signal LAn without being decreased beyond threshold (see a dotted-circled part in FIG. 22). This makes it possible to stabilize operation thereafter.

The above described Examples can be combined in various patterns. For example, each of the configurations of Examples 2 through 5 can be combined with only the configuration of Example 1.

Figure 23:
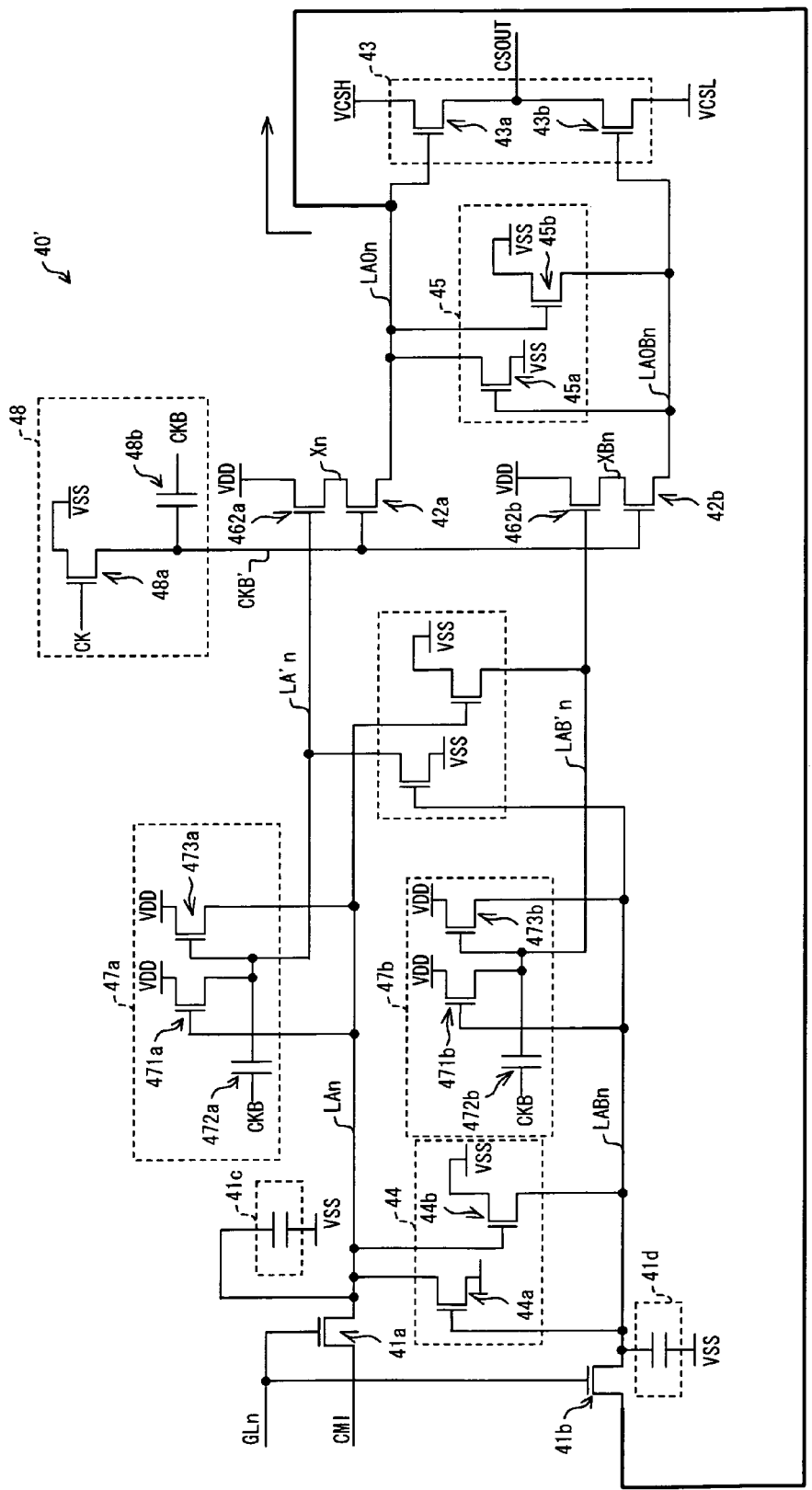
FIG. 23 is a circuit diagram illustrating a case where a signal LAOn is taken in as a polarity signal CMIB in the CS driver according to the embodiment.
Figure 24:
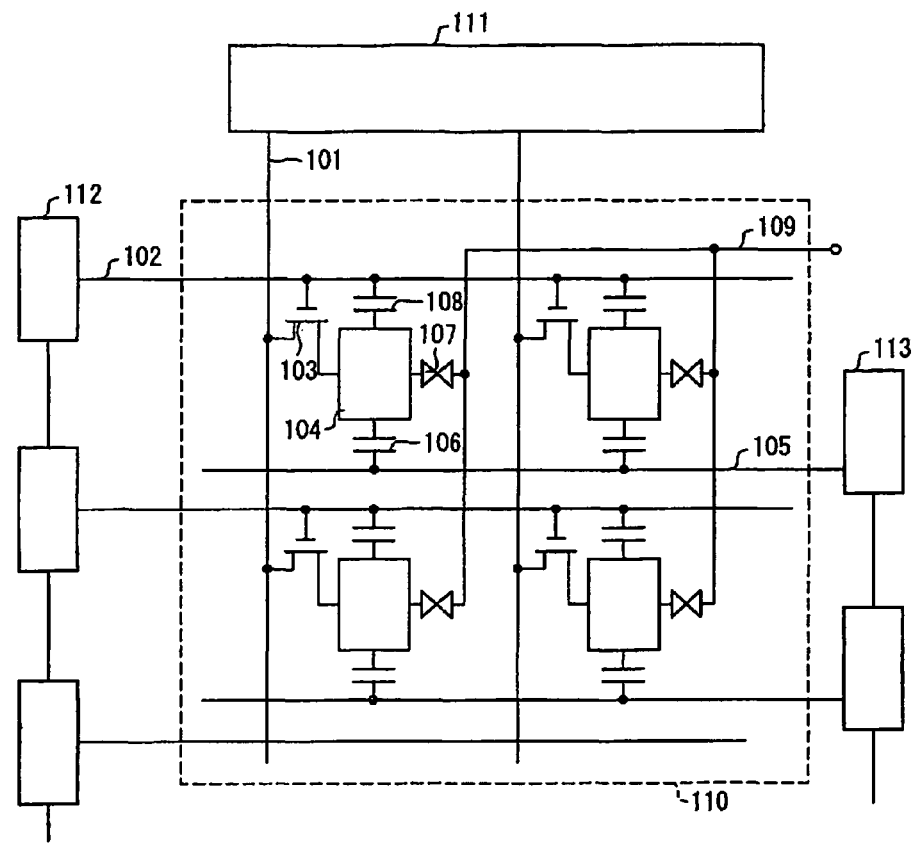
FIG. 24 is a block diagram illustrating a structure of a conventional liquid crystal display device which carries out CC driving.
Figure 25:
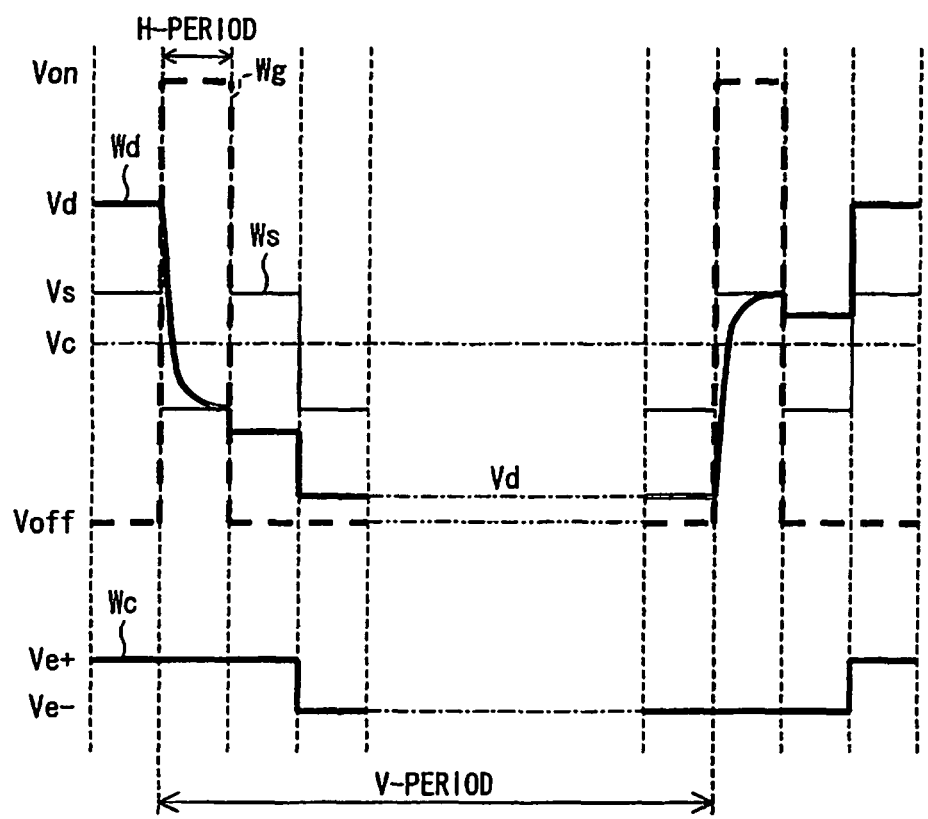
FIG. 25 is a timing chart illustrating waveforms of various signals in conventional CC driving.

As described above, when the transistors 41a and 41b are turned on, the polarity signals CMI and CMIB have polarities opposite to each other. Accordingly, the signals LAOn and LABOn which are outputted from the transfer switch circuit 42 have respective different potential levels (levels H and L). Therefore, when one of the signals is at the level H, the other is outputted at the level L. This allows CS signals to be outputted whose potential levels are inverted in each frame. According to the configuration, for example, when a polarity signal CMI at the level H is supplied to the CS driver 40' for generating a CS signal at the level H, a signal LAOn is supplied at the level L to the transistor 43a of the analogue switch circuit 43. Then, a polarity signal (CMIB) at the level L is required for generating a CS signal at the level L. In response to the case, as shown in FIG. 23, the signal LAOn can be taken in as the polarity signal CMIB. This makes it possible to input signals at the respective levels H and L alternately in each frame. Accordingly, a signal line for the signal CMIB from the control circuit can be omitted, whereby a structure of the circuit can be simplified.

Note that switch elements in the CS driver can be made up of D-latch circuits.

A signal which is outputted from the gate driver used in the CS driver of the present invention can be the above described gate signal or a setting signal outputted from the shift register of the gate driver to another stage (e.g., a next stage).

As described above, according to the display driving circuit and the display driving method of the present invention, the capacity coupling line driving circuit outputs a potential shift signal to a row on which the capacity coupling line driving circuit is provided. The potential shift signal is outputted in accordance with an output signal outputted to the row from the scan signal line driving circuit.

According to the configuration and the method, the problem of complicated circuit structure described in the section "Summary of Invention" can be solved, and CC driving can be carried out with a simple structure.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention can be particularly suitably applied to driving of an active matrix liquid crystal display device.

The invention claimed is:

1. A display driving circuit for driving a display panel which includes scan signal lines, data signal lines, pixel electrodes, switching elements, and capacity coupling lines, wherein the scan signal lines turn on and off the switching elements corresponding thereto, and each of the switching elements has (i) one terminal connected with one of the respective pixel electrodes and (ii) another terminal connected with one of the respective data signal lines, and the capacity coupling lines are capacity-coupled with corresponding ones of the pixel electrodes, wherein each of the scan signal lines forms a row together with switching elements connected thereto, pixel electrodes respectively connected to these switching elements, and one of the capacity coupling lines capacity-coupled with these pixel electrodes, the display driving circuit driving the display panel to carry out a gradation display in accordance with electric potentials of the pixel electrodes, the display driving circuit comprising:

a scan signal line driving circuit for driving the scan signal lines;

a data signal line driving circuit for outputting a data signal which is based on a video signal; and a capacity coupling line driving circuit for outputting a potential shift signal whose electric potential is switched over in accordance with a polarity of the data signal, for each row, the capacity coupling line driving circuit outputting a potential shift signal to a row in accordance with an output signal outputted to the row from the scan signal line driving circuit, wherein:

the capacity coupling line driving circuit outputs the potential shift signal after at least a single horizontal scan period has passed from when the output signal is outputted from the scan signal line driving circuit, the capacity coupling line driving circuit includes a transfer circuit for securing at least a single horizontal period between when the output signal is outputted from the scan signal line driving circuit and when the potential shift signal is outputted, the capacity coupling line driving circuit includes:

a memory circuit which (i) stores a first signal corresponding to change of a potential level of the output signal outputted from the scan signal line driving circuit and (ii) outputs the first signal to the transfer circuit, the transfer circuit which outputs a second signal which is derived from the first signal with at least a single horizontal scan period, the first signal being outputted from the memory circuit, and a switch circuit which generates the potential shift signal based on a potential level of the second signal outputted from the transfer circuit, and wherein:

the memory circuit includes a first transistor having (i) a first electrode which receives a first input signal and (ii) a control electrode which receives the output signal outputted from the scan signal line driving circuit, a first capacitor element provided between a second electrode of the first transistor and a reference power supply line through which a reference voltage is supplied, a second transistor having (i) a first electrode which receives a second input signal and (ii) a control electrode connected to the control electrode of the first transistor, and a second capacitor element provided between a second electrode of the second transistor and the reference power supply line through which the reference voltage is supplied;

the transfer circuit includes a third transistor having (i) a first electrode connected to the second electrode of the first transistor and (ii) a control electrode which receives a clock signal, and a fourth transistor having (i) a first electrode connected to the second electrode of the second transistor and (ii) a control electrode which receives the clock signal; and the switch circuit includes a fifth transistor having (i) a control electrode connected to a second electrode of the third transistor, (ii) a first electrode connected to an output terminal, and (iii) a second electrode which receives a first power supply voltage, and a sixth transistor having (i) a control electrode connected to a second electrode of the fourth transistor, (ii) a first electrode connected to the output terminal, and (iii) a second electrode which receives a second power supply voltage.

2. The display driving circuit as set forth in claim 1, wherein:

the capacity coupling line driving circuit causes a potential level of the first signal to be changed from a first potential level to a second potential level when a potential level of the output signal outputted from the scan signal line driving circuit is changed from the first potential level to the second potential level, the second potential level being a potential level at which a transistor is turned on, the capacity coupling line driving circuit outputs the second signal derived from the first signal, after the third transistor is turned on in response to a change in a potential level of the clock signal, and the capacity coupling line driving circuit outputs, as the potential shift signal, a signal at a potential level of the first power supply voltage, at a time when the potential level of the second signal is changed from the first potential level to the second potential level.

3. The display driving circuit as set forth in claim 1, wherein:

the capacity coupling line driving circuit causes a potential level of the first signal to be changed from a second potential level to a first potential level when a potential level of the output signal outputted from the scan signal line driving circuit is changed from the first potential level to the second potential level, the second potential level being a potential level at which a transistor is turned on, the capacity coupling line driving circuit outputs the second signal derived from the first signal, after the fourth transistor is turned on in response to a change in a potential level of the clock signal, and the capacity coupling line driving circuit outputs, as the potential shift signal, a signal at a potential level of the second power supply voltage, at a time when the potential level of the second signal is changed from the first potential level to the second potential level.

4. The display driving circuit as set forth in claim 1, wherein:

the capacity coupling line driving circuit further includes a booster circuit which (i) increases a potential level of the first signal outputted from the memory circuit and (ii) supplies, to the transfer circuit, the first signal whose potential level is thus increased.

5. The display driving circuit as set forth in claim 4, wherein:

the booster circuit includes a seventh transistor having (i) a first electrode which receives a predetermined voltage at a second potential level at which a transistor is turned on and (ii) a control electrode connected to the second electrode of the first transistor, a third capacitor element provided between the control electrode of the seventh transistor and a clock signal line through which a clock signal is supplied, an eighth transistor having (i) a first electrode which receives a predetermined voltage at the second potential level and (ii) a control electrode connected to the second electrode of the second transistor, a fourth capacitor element provided between the control electrode of the eighth transistor and the clock signal line through which the clock signal is supplied.

6. The display driving circuit as set forth in claim 1, wherein:

the capacity coupling line driving circuit further includes a refresh circuit which causes (i) a potential level of the first signal outputted from the memory circuit to be increased every single horizontal scan period or less frequently than every single horizontal scan period, and (ii) the potential level of the first signal to be maintained during a period in which the potential level is not increased.

7. The display driving circuit as set forth in claim 6, wherein:

the refresh circuit includes a ninth transistor having (i) a first electrode which receives a predetermined voltage at a second potential level at which a transistor is turned on and (ii) a control electrode connected to the second electrode of the first transistor, a fifth capacitor element provided between a second electrode of the ninth transistor and a clock signal line through which a clock signal is supplied, a tenth transistor having (i) a first electrode which receives the predetermined voltage at the second potential level, (ii) a control electrode connected to a second electrode of the ninth transistor, and (iii) a second electrode connected to the second electrode of the first transistor, an eleventh transistor having (i) a first electrode which receives the predetermined voltage at the second potential level and (ii) a control electrode connected to the second electrode of the second transistor, a sixth capacitor element provided between a second electrode of the eleventh transistor and the clock signal line through which the clock signal is supplied, and a twelfth transistor having (i) a first electrode which receives the predetermined voltage at the second potential level, (ii) a control electrode connected to the second electrode of the eleventh transistor, and (iii) a second electrode connected to the second electrode of the first transistor.

8. The display driving circuit as set forth in claim 6, wherein:

the capacity coupling line driving circuit further includes a capacity reduction switch circuit which reduces capacity load on the refresh circuit.

9. The display driving circuit as set forth in claim 8, wherein:

the capacity reduction switch circuit includes a sixteenth transistor having (i) a first electrode which receives a clock signal and (ii) a control electrode connected to the second electrode of the first transistor, and a seventeenth transistor having (i) a first electrode which receives the clock signal and (ii) a control electrode connected to the second electrode of the second transistor, the refresh circuit includes the ninth transistor having (i) the first electrode which receives the predetermined voltage at the second potential level, (ii) the second electrode connected to a second electrode of the sixteenth transistor via the fifth capacitor element, and (iii) the control electrode connected to the second electrode of the first transistor, the tenth transistor having (i) the first electrode which receives the predetermined voltage at the second potential level, (ii) the control electrode connected to a second electrode of the ninth transistor, and (iii) the second electrode connected to the second electrode of the first transistor, the eleventh transistor having (i) the first electrode which receives the predetermined voltage at the second potential level, (ii) the second electrode connected to a second electrode of the seventeenth transistor via the sixth capacitor element, and (iii) the control electrode connected to the second electrode of the second transistor, and the twelfth transistor having (i) the first electrode which receives the predetermined voltage at the second potential level, (ii) the control electrode connected to the second electrode of the eleventh transistor, and (iii) the second electrode connected to the second electrode of the second transistor.

10. The display driving circuit as set forth in claim 1, wherein:
the capacity coupling line driving circuit further includes a potential stabilizing circuit which fixes the first potential level of at least one of the first signal and the second signal.

11. The display driving circuit as set forth in claim 10, wherein:
the potential stabilizing circuit includes
a thirteenth transistor having (i) a first electrode which receives a reference voltage for the first potential level, (ii) a control electrode connected to the second electrode of the second transistor, and (iii) a second electrode connected to the second electrode of the first transistor, and
a fourteenth transistor being arranged in parallel with the first transistor and having (i) a first electrode which receives the reference voltage, (ii) a control electrode connected to the second electrode of the first transistor, and (iii) a second electrode connected to the second electrode of the second transistor.

12. The display driving circuit as set forth in claim 11, wherein:
when a signal outputted from the first transistor is changed from a first potential level to a second potential level at which a transistor is turned on, the potential stabilizing circuit stabilizes, at the reference voltage, a potential level of a signal outputted from the second transistor; and
when a signal outputted from the second transistor is changed from the first potential level to the second potential level, the potential stabilizing circuit stabilizes, at the reference voltage, a potential level of a signal outputted from the first transistor.

13. The display driving circuit as set forth in claim 1, wherein:
the capacity coupling line driving circuit further includes a clock booster circuit which (i) increases a potential level of the first signal outputted from the memory circuit and then (ii) supplies the second signal to the switch circuit, the second signal being derived from the first signal whose potential level is thus increased.

14. The display driving circuit as set forth in claim 13, wherein:
the clock booster circuit includes
a fifteenth transistor having (i) a first electrode which receives a reference voltage, (ii) a control electrode which receives an inversion clock signal, and (iii) a second electrode connected to the control electrodes of the third and fourth transistors, and
a seventh capacitor element which has (i) one end connected to a clock signal line through which the clock signal is supplied and (ii) the other end connected to the second electrode of the fifteenth transistor.

15. The display driving circuit as set forth in claim 1, wherein:
the first electrode of the second transistor and the control electrode of the fifth transistor are connected to each other; and
the second signal is supplied, as the second input signal, to the first electrode of the second transistor.

16. A display device comprising a display driving circuit as set forth in claim 1, and the display panel.

17. The display device as set forth in claim 16 which is a liquid crystal display device.

* * * * *